United States Patent
Li et al.

(10) Patent No.: US 11,031,456 B2
(45) Date of Patent: Jun. 8, 2021

(54) ROLLED-UP ELECTROMAGNETIC COMPONENT FOR ON-CHIP APPLICATIONS AND METHOD OF MAKING A ROLLED-UP ELECTROMAGNETIC COMPONENT

(71) Applicant: The Board of Trustees of the University of Illinois, Urbana, IL (US)

(72) Inventors: Xiuling Li, Champaign, IL (US); Wen Huang, Champaign, IL (US); Zhendong Yang, Urbana, IL (US); Mark D. Kraman, Urbana, IL (US); Jimmy Ni, Greenbelt, MD (US); Zihao Ou, Urbana, IL (US); Qian Chen, Urbana, IL (US); J. Gary Eden, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/434,524

(22) Filed: Jun. 7, 2019

(65) Prior Publication Data

US 2019/0378890 A1 Dec. 12, 2019

Related U.S. Application Data

(60) Provisional application No. 62/682,569, filed on Jun. 8, 2018.

(51) Int. Cl.
*H01L 27/08* (2006.01)
*H01L 49/02* (2006.01)
*H01L 21/02* (2006.01)

(52) U.S. Cl.
CPC .......... *H01L 28/10* (2013.01); *H01L 21/0217* (2013.01); *H01L 21/02164* (2013.01); *H01L 21/02274* (2013.01)

(58) Field of Classification Search
CPC .......... H01L 21/0217; H01L 21/02164; H01L 21/02274
See application file for complete search history.

(56) References Cited

U.S. PATENT DOCUMENTS

2014/0103486 A1* 4/2014 Li ..................... H01L 21/4814
257/531
2014/0246764 A1 9/2014 Li et al.
(Continued)

OTHER PUBLICATIONS

Ahn et al., "A Comparison of Two Micromachined Inductors (Bar- and Meander-type) for Fully Integrated Boost DC/DC Power Converters," *IEEE Trans. Power Electron.*, 11:2 (Mar. 1996) pp. 239-245.

(Continued)

*Primary Examiner* — Phuc T Dang
(74) *Attorney, Agent, or Firm* — Brinks Gilson & Lione

(57) ABSTRACT

A rolled-up electromagnetic component for on-chip applications comprises: a multilayer sheet in a rolled configuration comprising at least one turn about a longitudinal axis; a core defined by a first turn of the rolled configuration; and a soft magnetic material disposed within the core, where the multilayer sheet comprises a conductive pattern layer on a strain-relieved layer. A method of making a rolled-up electromagnetic component for on-chip applications includes forming a rolled-up device comprising: a multilayer sheet in a rolled configuration having at least one turn about a longitudinal axis, where the multilayer sheet comprises a conductive pattern layer on a strain-relieved layer; and a core defined by a first turn of the rolled configuration. The method further includes introducing a soft magnetic material into the core.

19 Claims, 17 Drawing Sheets

(56) References Cited

U.S. PATENT DOCUMENTS

| | | |
|---|---|---|
| 2015/0099116 A1 | 4/2015 | Li et al. |
| 2015/0137930 A1 | 5/2015 | Li et al. |
| 2016/0301377 A1 | 10/2016 | Li et al. |
| 2018/0012695 A1* | 1/2018 | Kim ................... H01F 27/025 |
| 2018/0075956 A1 | 3/2018 | Li et al. |

OTHER PUBLICATIONS

Arora et al., "Membrane folding to achieve three-dimensional nanostructures: Nanopatterned silicon nitride folded with stressed chromium hinges," *Applied Physics Letters*, 88, 053108 (2006) pp. 1-4.

Bae et al., "High Q Ni—Zn—Cu Ferrite Inductor for On-Chip Power Module," *IEEE Transactions on Magnetics*, 45:10 (Oct. 2009) pp. 4773-4776.

Bang et al., "Ni—Zn Ferrite Screen Printed Power inductors for Compact DC-DC Power Converter Applications," *IEEE Transactions on Magnetics*, 45:6 (Jun. 2009) pp. 2762-2765.

Bianucci et al., "Self-organized InAs/InGaAsP quantum dot tube lasers," *Applied Physics Letters*, 101, 031104 (2012) pp. 1-5.

Bibo et al., "Electromagnetic ferrufluid-based energy harvester," *Physics Letters A*, 376 (2012) pp. 2163-2166.

Cabanes et al., "Magnetic induction and diffusion mechanisms in a liquid sodium spherical Collette experiment," *Physical Review E*. 90, 043018 (2014) pp. 1-16.

Ding et al., "Ferrofluid-Impregnated Paper Actuators," *Journal of Microelectromechanical Systems*, 20:1 (Feb. 2011) pp. 59-64.

Fasshauer et al., "Absence of DNA double-strand breaks in human peripheral blood mononuclear cells after magnetic resonance imaging assessed by γH2AX flow cytometry: a prospective blinded trial," *Journal of Cardiovascular Magnetic Resonance*, 18:1 (2016) pp. 1149-1156.

Froeter et al., "3D hierarchical architectures based on self-rolled-up silicon nitride membranes," *Nanotechnology*, 24, 475301 (2013) pp. 1-10.

Froeter et al., "Toward Intelligent Synthetic Neural Circuits: Directing and Accelerating Neuron Cell Growth by Self-Rolled-Up Silicon Nitride Microtube Array," *Acs Nano*, 8:11 (2014) pp. 11108-11117.

Golod et al., "Fabrication of conducting GeSi/Si micro- and nanotubes and helical microcoils," *Semiconductor Science and Technology*, 16 (2001) pp. 181-185.

Hardy et al., "128-Channel Body MRI With a Flexible High-Density Receiver-Coil Array," *Journal of Magnetic Resonance Imaging*, 28 (2008) pp. 1219-1225.

Hazelton et al., "Recent Developments in 2G HTS Coil Technology," *IEEE Transactions on Applied Superconductivity*, 19:3 (Jun. 2009) pp. 2218-2222.

Hu et al., "Magnetoacoustic imaging of human liver tumor with magnetic induction," *Applied Physics Letters*, 98, 023703 (2011) pp. 1-4.

Huang et al., "On-Chip Inductors with Self-Rolled-Up SiNx Nanomembrane Tubes: A Novel Design Platform for Extreme Miniaturization," *Nano Letters*, 12 (2012) pp. 6283-6288.

Huang et al., "Rolled-Up Optical Microcavities with Subwavelength Wall Thicknesses for Enhanced Liquid Sensing Applications," *ACS Nano*, 4:6, (2010) pp. 3123-3130.

Huang et al., "CMOS-compatible on-chip self-rolled-up inductors for RF/mm-wave applications," *IEEE MTT-S International Microwave Symposium (IMS)*, (2017) pp. 1645-1648.

Huang et al., "Three-dimensional radio-frequency transformers based on a self-rolled-up membrane platform," *Nature Electronics*, 1, (May 2018) pp. 305-313.

Khan et al., "Elimination of Filter Inductor in Switching Cell AC-AC Converters Using Magnetic Integration," *IEEE Transactions on Power Electronics*, 31:9 (Sep. 9, 2016) pp. 6317-6326.

Klein et al., "High winding density micro coils for magnetic actuators," *Microsystem Technologies*, 4 (1998) pp. 172-175.

Kratt et al., "A fully MEMS-compatible process for 3D high aspect ratio micro coils obtained with an automatic wire bonder," *Journal of Micromechanics and Microengineering*, 20, 015021 (2010) pp. 1-12.

Lévy et al., "Magnetic Field-Induced Superconductivity in the Ferromagnet URhGe," *Science*, 309 (2005) pp. 1343-1346.

Li et al., "A High-Q In-Silicon Power Inductor Designed for Wafer-Level Integration Oil of Compact DC-DC Converters," *IEEE Transactions on Power Electronics*, 32:5, (May 2017) pp. 3858-3867.

Li et al., "Three-Dimensional Solenoids Realized via High-Density Deep Coil Stacking for MEMS Application," *IEEE Electron Device Letters*, 33:3 (Mar. 2012) pp. 432-434.

Li et al., "Multi-excitation Magnetoacoustic Tomography with Magnetic Induction for Bioimpedance Imaging," *IEEE Transactions on Medical Imaging*, 29:10 (Oct. 10, 2010) pp. 1759-1767.

Li, "Self-rolled-up microtube ring resonators: a review of geometrical and resonant properties," *Advances in Optics and Photonics*, 3 (2011) pp. 366-387.

Li, "Strain induced semiconductor nanotubes: from formation process to device applications," *Journal of Physics D: Applied Physics*, 41 193001 (2008), pp. 1-12.

Lim et al., "A Class of Ceramic-Based Chip Inductors for Hybrid Integration in Power Supplies," *IEEE Transactions on Power Electronics*, 23:3, (May 2008) pp. 1556-1564.

Luchnikov et al., "Toroidal hollow-core microcavities produced by self-rolling of strained polymer bilayer films," *Journal of Micromechanics and Microengineering*, 18, 035041 (2008) pp. 1-6.

Marmugi et al., "Optical Magnetic Induction Tomography of the Heart," *Scientific Reports*, 6, 23962 (2016) pp. 1-8.

Meyer et al., "A Micromachined Wiring Board With Integrated Microinductor For Chip-Scale Power Conversion." *IEEE Trans Power Electron*.; 29:11 (Nov. 2014) pp. 6052-6063.

Orlando et al., "Low-Resistance Integrated Toroidal Inductor For Power Management," *IEEE Trans. Magn.*, 42:10 (Oct. 2006) pp. 3374-3376.

Oyama et al., "Development of Compact Ultra-Low-Field MRI System Using an Induction Coil," *IEEE Transactions on Magnetics*, 53:11, (Nov. 2017) pp. 1-4.

Petridou et al., "Pushing the limits of high-resolution functional MRI using a simple high-density multi-element coil design," *NMR in Biomedicine*, 26 (2013) pp. 65-73.

Pislaru-Danescu et al., "Prototyping a Ferrofluid-Cooled Transformer," *IEEE Transactions on Industry Applications*, 49:3 (May/Jun. 2013) pp. 1289-1298.

Prinz et al., "Free-standing and overgrown InGaAs/GaAs nanotubes, nanohelices and their arrays," *Physica E.*, 6 (2000) pp. 828-831.

Scherer et al., "Ferrofluids: Properties and Applications," *Brazilian Journal of Physics*, 35:3A, (Sep. 2005) pp. 718-727.

Schmidt et al., "Three-dimensional nano-objects evolving from a two-dimensional layer technology," *Advanced Materials*, 13:10 (May 2017) pp. 756-759.

Songmuang et al., "From rolled-up Si microtubes to SiOx/Si optical ring resonators," *Microelectronic Engineering*, 84 (2007) pp. 1427-1430.

Sun et al., "Magnetic Induction Communications for Wireless Underground Sensor Networks," *IEEE Transactions on Antennas and Propagation*, 58:7, (Jul. 2010) pp. 2426-2435.

Tang et al., "Tubular optical microcavities of indefinite medium for sensitive liquid refractometers," *Lab on a Chip*, 16 (2016) pp. 182-187.

Tian et al., "Controlled Transfer of Single Rolled-Up InGaAs—GaAs Quantum-Dot Microtube Ring Resonators Using Optical Fiber Abrupt Tapers," *IEEE Photonics Technology Letters*, 22:5, (Mar. 1, 2010) pp. 311-313.

Wang et al., "Micro-inductors integrated on silicon for power supply on chip," *Journal of Magnetism and Magnetic Materials*, 316 (Feb. 24, 2007) pp. e233-e237.

Wang et al., "Thin-Film-Integrated Power Inductor on Si and Its Performance in an 8-MHz Buck Converter," *IEEE Transactions on Magnetics*, 44:11 (Nov. 2008) pp. 4096-4099.

(56) References Cited

OTHER PUBLICATIONS

Weijers et al., "High Field Magnets With HTS Conductors," *IEEE Transactions on Applied Superconductivity*, 20:3, (Jun. 3, 2010) pp. 576-582.

Yelland et al., "High-field superconductivity at an electronic topological transition in URhGe," *Nature Physics*, 7:11 (Nov. 2011) pp. 890-894.

Yu et al., "Ultra-Small, High-Frequency, and Substrate-Immune Microtube Inductors Transformed from 2D to 3D," *Scientific Reports*, 5, 9661 (Apr. 27, 2015) pp. 1-6.

Yun et al., "Size- and Composition-Dependent Radio Frequency Magnetic Permeability of Iron Oxide Nanocrystals," *ACS Nano*, 8:12 (2014) pp. 12323-12337.

Zhong et al., "A Methodology for Making a Three-Coil Wireless Power Transfer System More Energy Efficient Than a Two-Coil Counterpart for Extended Transfer Distance," *IEEE Transactions ore Power Electronics*, 30:2 (Feb. 2015) pp. 933-942.

\* cited by examiner

ROLLED-UP ELECTROMAGNETIC COMPONENT FOR ON-CHIP APPLICATIONS AND METHOD OF MAKING A ROLLED-UP ELECTROMAGNETIC COMPONENT

RELATED APPLICATIONS

The present patent document claims the benefit of priority under 35 U.S.C. § 119(e) to U.S. Provisional Patent Application No. 62/682,569, filed on Jun. 8, 2018, and hereby incorporated by reference in its entirety.

FEDERALLY SPONSORED RESEARCH OR DEVELOPMENT

This invention was made with government support under award number EEC 1449548 from the National Science Foundation, award number IIP 17-01047 from the National Science Foundation, and award number DE-FG0207ER46471 from the Department of Energy, Basic Energy Sciences. The government has certain rights in the invention.

BACKGROUND

Electrically controlled generation of strong magnetic induction (e.g., up to Tesla level) at room temperature is a topic of broad interest in a wide range of science and engineering applications, such as magnetic resonance imaging, DNA analyses, biological behavior and power electronics, etc. Magnetic induction provides essential functions in research and industry, and there is an ever-increasing demand to raise power density and reduce size and cost. One of the barriers to maximizing power density lies in the difficulty of minimizing power inductors. Making inductors with small footprints but large power handling ability often mandates conflicting requirements in designs and processes.

BRIEF SUMMARY

A rolled-up electromagnetic component for on-chip applications comprises: a multilayer sheet in a rolled configuration comprising at least one turn about a longitudinal axis; a core defined by a first turn of the rolled configuration; and a soft magnetic material disposed within the core, where the multilayer sheet comprises a conductive pattern layer on a strain-relieved layer. The rolled-up electromagnetic component may alternatively be referred to as a rolled-up magnetic component.

A method of making a rolled-up electromagnetic component for on-chip applications includes forming a rolled-up device comprising: (a) a multilayer sheet in a rolled configuration having at least one turn about a longitudinal axis, where the multilayer sheet comprises a conductive pattern layer on a strain-relieved layer; and (b) a core defined by a first turn of the rolled configuration. The method further includes introducing a soft magnetic material into the core.

BRIEF DESCRIPTION OF THE DRAWINGS

FIGS. 1A-1B show an exemplary strained layer comprising a top sublayer in tension and a bottom sublayer in compression deposited on a sacrificial layer on a substrate, and FIGS. 1C-1D show schematically the release and subsequent roll-up of the strained layer from the underlying sacrificial layer to form a rolled-up device.

in FIG. 3A, a magnetic layer comprises the soft magnetic material; in FIG. 3B magnetic particles comprise the soft magnetic material; and in FIG. 3C, a solid body comprises the soft magnetic material.

DETAILED DESCRIPTION

Described herein are routes to achieving unprecedented high-density and large current-handling 3D coil structures for magnetic induction using planar semiconductor processing methods and materials. The schemes involve geometric transformation of two-dimensional (2D) multilayer sheets or membranes into multi-turn 3D microtubes by self-rolled-up membrane (S-RuM) nanotechnology, and the integration of soft magnetic materials into the core. Using this technology, milliTesla- and Tesla-level rolled-up magnetic inductors for high power density circuit applications may be fabricated. Arrays of the rolled-up magnetic inductors may be able to provide on-chip energy storage via magnetic fields. The ~1 W power capability achieved in experiments suggests that large arrays of the rolled-up inductors may be capable of storing extraordinary power levels and at large power densities. The technology may be applicable also to radiofrequency (RF) and millimeter-wave inductors, among other electromagnetic components.

A more condensed magnetic field distribution and energy storage in 3D space, and thus a higher inductance density, may be achieved for rolled-up electromagnetic components—even those without a magnetic material in the core—than for traditional planar devices. Moreover, the majority of the magnetic field distribution of rolled-up inductors is above the substrate, which provides excellent immunity to parasitic substrate effects. Prior results demonstrate that rolled-up air-core inductors (i.e., rolled-up components with no soft magnetic material in the core) exhibit an inductance at the level of several nH, which indicates up to tens of microTesla ($\mu T$) magnetic induction in the core. In this disclosure, a set of process strategies are described for achieving milliTesla-(mT) to Tesla-level magnetic induction. The integration of a magnetic core in the rolled-up electromagnetic component may result in a 2-times to 1000-times enhancement in the magnetic flux density, depending on factors such as the magnetic properties of the soft magnetic material.

As is known in the art, soft magnetic materials, in contrast to hard magnetic materials, are easily magnetized and demagnetized. Soft magnetic materials typically exhibit values of intrinsic coercivity of less than 1000 Nm and have high values of permeability, which is a measure of how readily the material responds to an applied magnetic field. Soft magnetic materials are used primarily to enhance and/or channel the flux produced by an electric current.

Figure 1A:
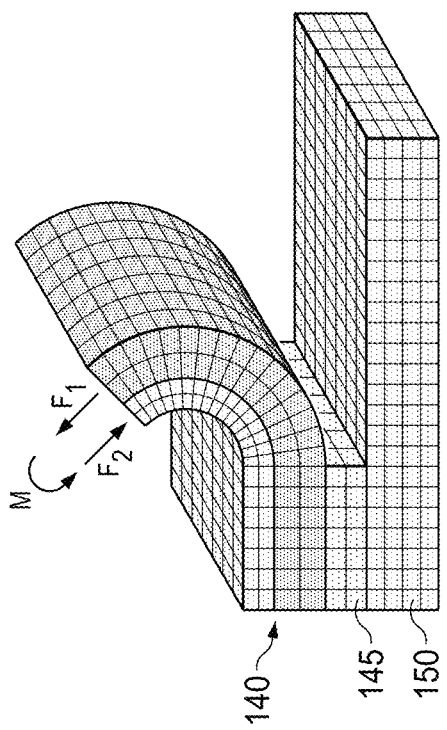
FIGS. 1A-1D provide an introduction to self-rolled-up membrane (S-RuM) technology.
Figure 1B:
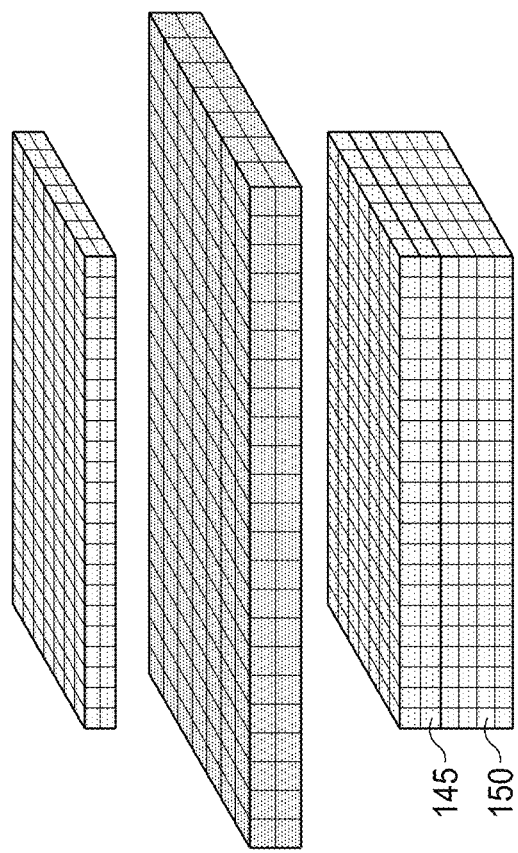
Figure 1C:
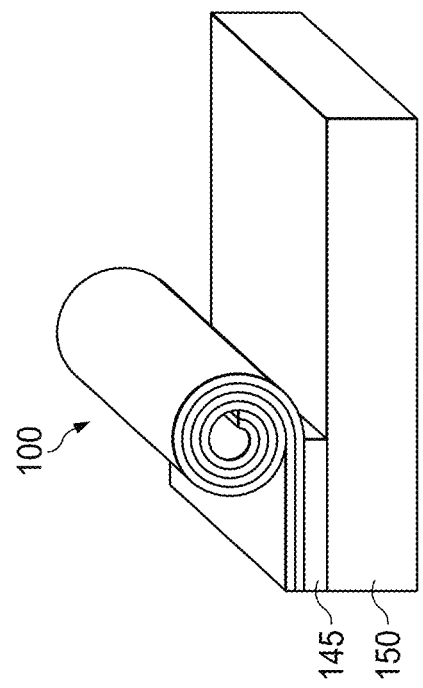
Figure 1D:
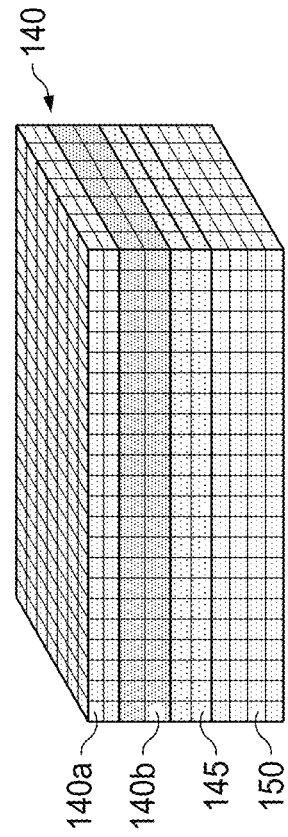

FIGS. 1A-1D provide an introduction to the self-rolling concept. Rolled-up micro- and nanodevice structures may form spontaneously when planar multilayer sheets including strained layers deform as a consequence of energy relaxation. Referring to FIGS. 1A and 1B, a planar multilayer sheet may include one or more additional layers (not visible in this figure) on an oppositely strained bilayer 140 (e.g., a top sublayer 140a in tension on a bottom sublayer 140b in compression), which is in contact with a sacrificial interlayer 145 on a substrate 150 and which may be referred to as a strained layer 140. The strained layer 140 may be released from the substrate 150 as the sacrificial layer 145 is etched away, as illustrated in FIG. 1C. Once released, the opposing strain within the layer 140 generates a net momentum, driving the planar sheet to scroll up and continue to roll into a tubular structure 100, as shown in FIG. 1D. During roll-up, residual stress in the strained layer 140 is fully or partially relieved. Accordingly, a rolled portion of the strained layer 140 may be referred to as a strain-relieved layer 140. Any additional layers can also provide additional residual stress (e.g., tensile stress) to facilitate rolling.

Figure 2A:
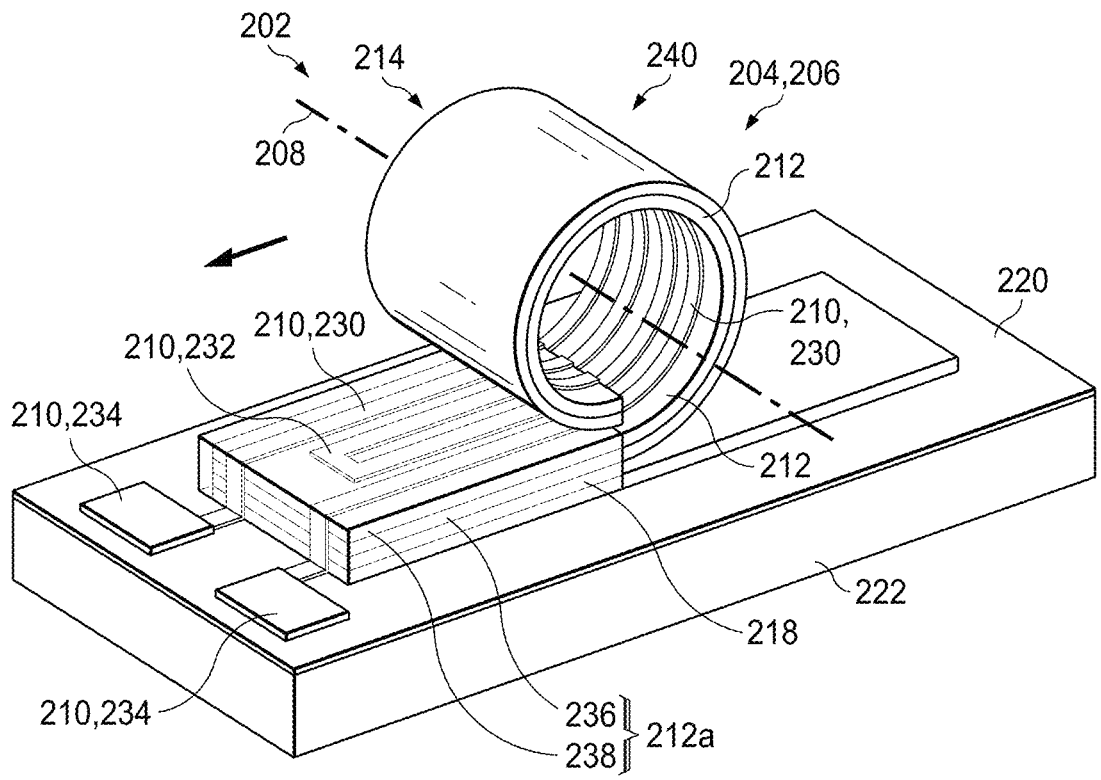
FIGS. 2A and 2B illustrate an exemplary rolled-up electromagnetic component for on-chip applications before (FIG. 2A) and after (FIG. 2B) integration with a soft magnetic material.
Figure 2B:
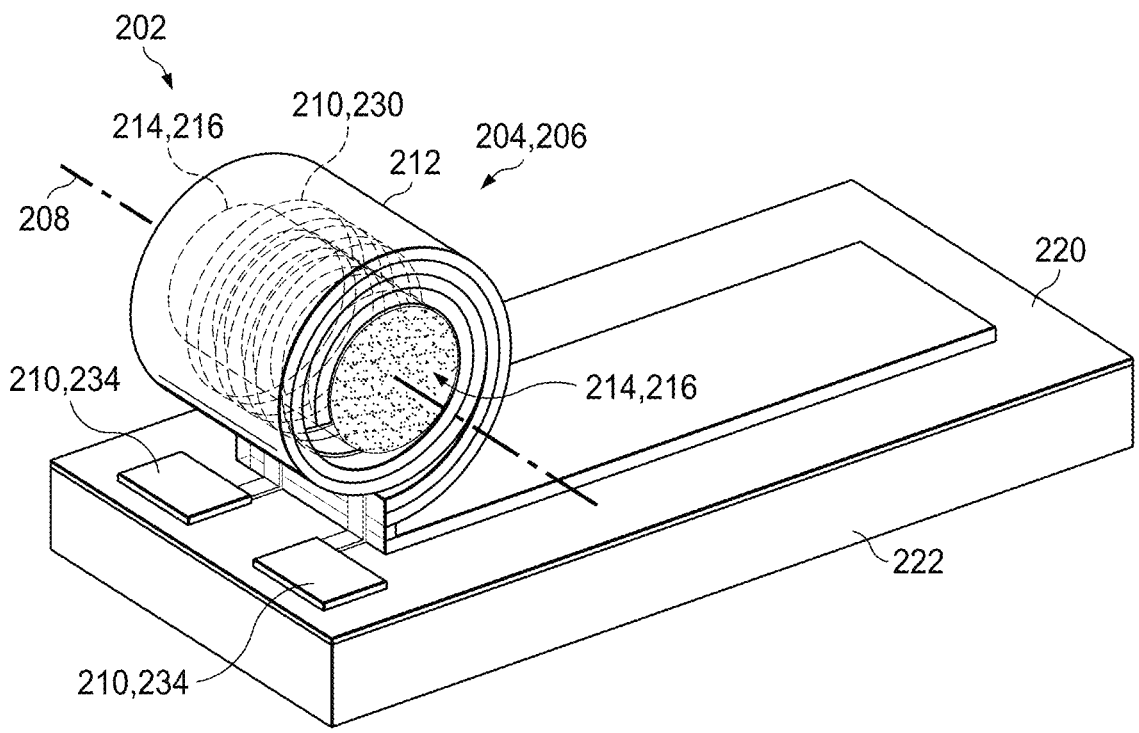
Figure 3A:
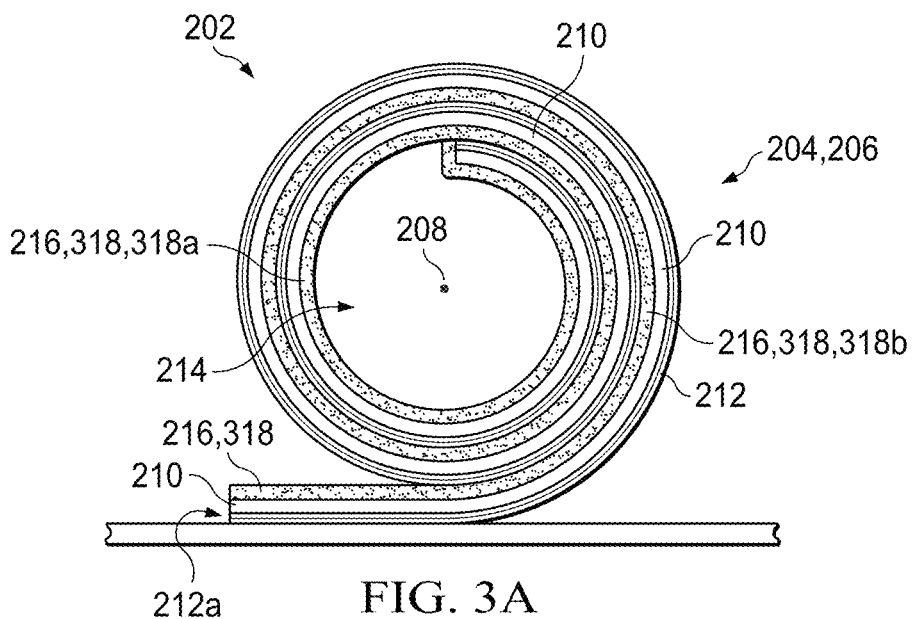
FIGS. 3A-3C show side-view schematics of exemplary rolled-up electromagnetic components, where each includes a soft magnetic material disposed within the core.
Figure 3B:
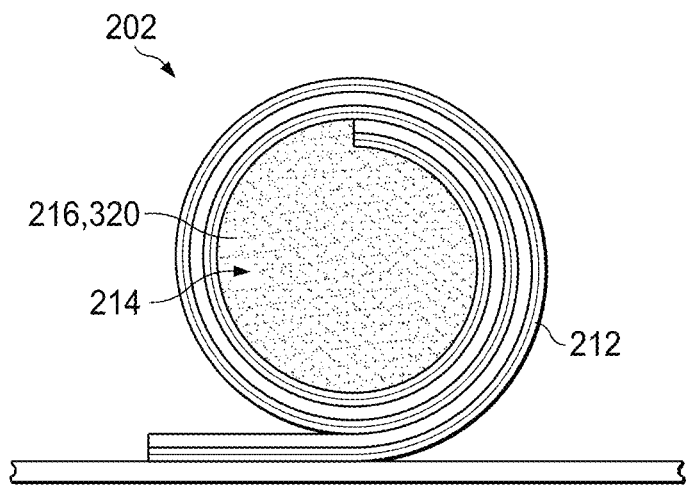
Figure 3C:
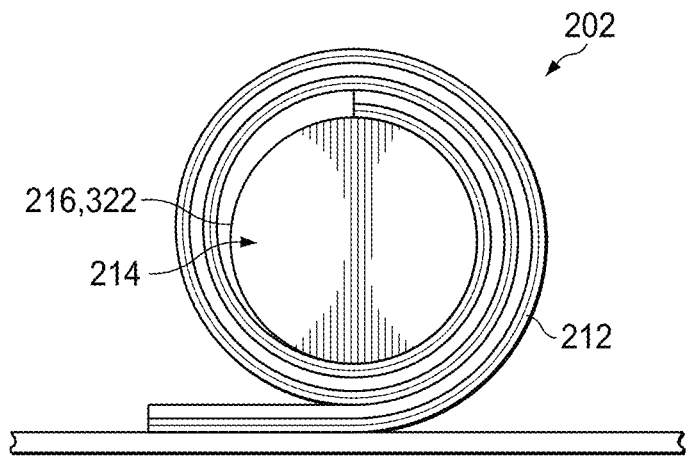

Referring now to FIGS. 2A and 2B, an exemplary rolled-up electromagnetic component 202 for on-chip applications is illustrated before (FIG. 2A) and after (FIG. 2B) integration with a soft magnetic material. The electromagnetic component 202 comprises a multilayer sheet 204 in a rolled configuration 206 having at least one turn about a longitudinal axis 208. The multilayer sheet 204 includes a conductive pattern layer 210 on a strain-relieved layer 212. A core 214 of the rolled-up electromagnetic component 202 is defined by a first turn of the rolled configuration 206, and a soft magnetic material 216 is disposed within the core 214. A magnetic layer 318, magnetic particles 320, and/or a solid body 322 may comprise the soft magnetic material 216, as illustrated in FIGS. 3A-3C. In other words, the soft magnetic material 216 may take the form of a magnetic layer 318, magnetic particles 320, and/or a solid body 322 positioned within the core 214. Although these embodiments are shown in separate figures, they are not mutually exclusive. For example, a rolled-up electromagnetic component 202 may include both a magnetic layer 318 and magnetic particles 320 comprising the soft magnetic material 216. Prior to integration with the soft magnetic material 216, the rolled-up electromagnetic component 202 may be referred to as a rolled-up air-core device structure, or more simply as a rolled-up device structure 240. The rolled-up electromagnetic component 202 may function as a rolled-up inductor, a rolled-up transformer, or a tubular resonant filter.

Experimental results discussed below indicate that rolled-up inductors prepared as described in this disclosure may exhibit an inductance of at least about 5 nH, at least about 7.5 nH, or at least about 1 $\mu$H at a frequency up to 10 MHz. The maximum operating frequency of the rolled-up inductors may be about 500 MHz, about 750 MHz, about 1 GHz, or about 5 GHz. The rolled-up inductors may exhibit an inductance density as large as 2.5 $\mu H/mm^2$, as large as 13 $pH/mm^3$, or as large as 23 $\mu H/mm^3$ and/or a quality factor of at least about 0.15 or at least about 0.2 at 10 MHz. The intensity of the magnetic induction may reach or exceed tens of milliTesla (approaching the Tesla level) in fabricated rolled-up inductors.

Referring to FIG. 3A, a magnetic layer 318 comprising the soft magnetic material 216 may be disposed on the conductive pattern layer 210. In an example where the rolled configuration 206 comprises multiple turns (i.e., more than one turn) about the longitudinal axis 208, a first portion 318a of the magnetic layer 318 may be disposed within the core 214 and a remaining portion 318b of the magnetic layer 318 may surround the core 214. The magnetic layer 318 may partially or fully surround the core 214 in the rolled configuration 206. The soft magnetic material 216 may wrap around the core 214 multiple times depending on the size of the magnetic layer 318 and the number of turns of the rolled configuration 206. As described below, the magnetic layer 318 comprising the soft magnetic material 216 may be formed on the conductive pattern layer prior to or after roll-up of the rolled-up electromagnetic component 202.

The soft magnetic material 216 may be distributed throughout the core 214, as illustrated in FIG. 3B, where magnetic particles 320 are packed within the core 214, or in the example of FIG. 3C, where a monolithic solid body 322 (such as a sintered body prepared from magnetic particles) is disposed within the core 214. Preferably, the soft magnetic material 216 is uniformly distributed throughout the core 214. The soft magnetic material 216 may be removably positioned within the core 214. In other words, it may be possible to insert, remove, and/or replace the soft magnetic material 216 as needed.

Figure 4A:
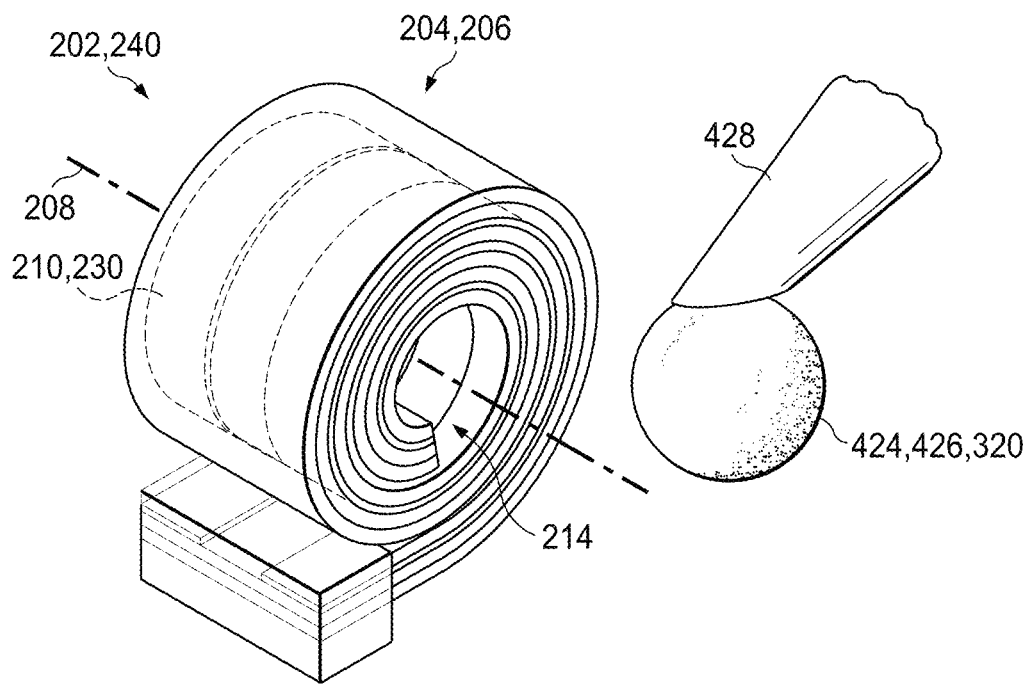
FIGS. 4A and 4B illustrate delivery of a ferrofluid comprising magnetic particles into the core of a rolled-up electromagnetic component.
Figure 4B:
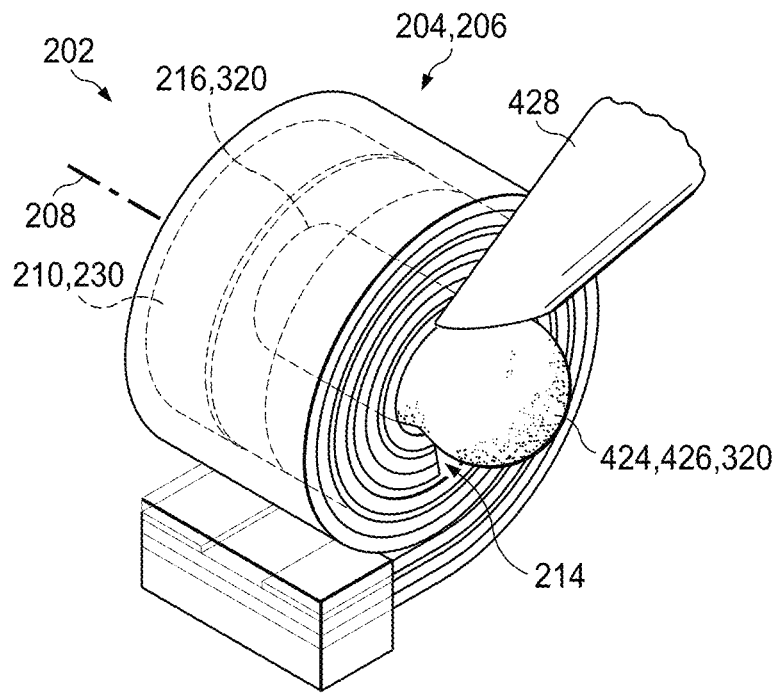

A ferrofluid 424 may be employed to deliver the magnetic particles 320 into the core 214, as illustrated in FIGS. 4A and 4B. The ferrofluid 424 may include magnetic particles 320 comprising the soft magnetic material 216 suspended in a carrier fluid 426, which may comprise an organic or aqueous solvent. A delivery needle 428 containing the ferrofluid 424 may be brought adjacent to an end of the rolled-up device structure 240, as illustrated in FIG. 4A. A pendant droplet of the ferrofluid 424 at the tip of the delivery needle 428 may be drawn into the core 214 by capillary forces, partially or completely filling the core 214, as illustrated in FIG. 4B. The ferrofluid 424 may be dried to remove the carrier fluid 426 while the magnetic particles 320 remain stably deposited in the core 214. Successive droplets of ferrofluid 424 may be delivered into the core 214 as needed, interspersed with drying steps, to increase the packing density of the magnetic particles 320.

Before discussing additional strategies to enhance the magnetic induction of the rolled-up electromagnetic component 202, the multilayer sheet 204 (including the patterned conductive layer 210 and the strain-relieved layer 212), the sacrificial layer 218, an optional protective layer 220, and the substrate 222 employed for fabrication are described, followed by various embodiments of the soft magnetic material 216 (magnetic layer 318, magnetic particles 320, solid body 322).

Figure 5:
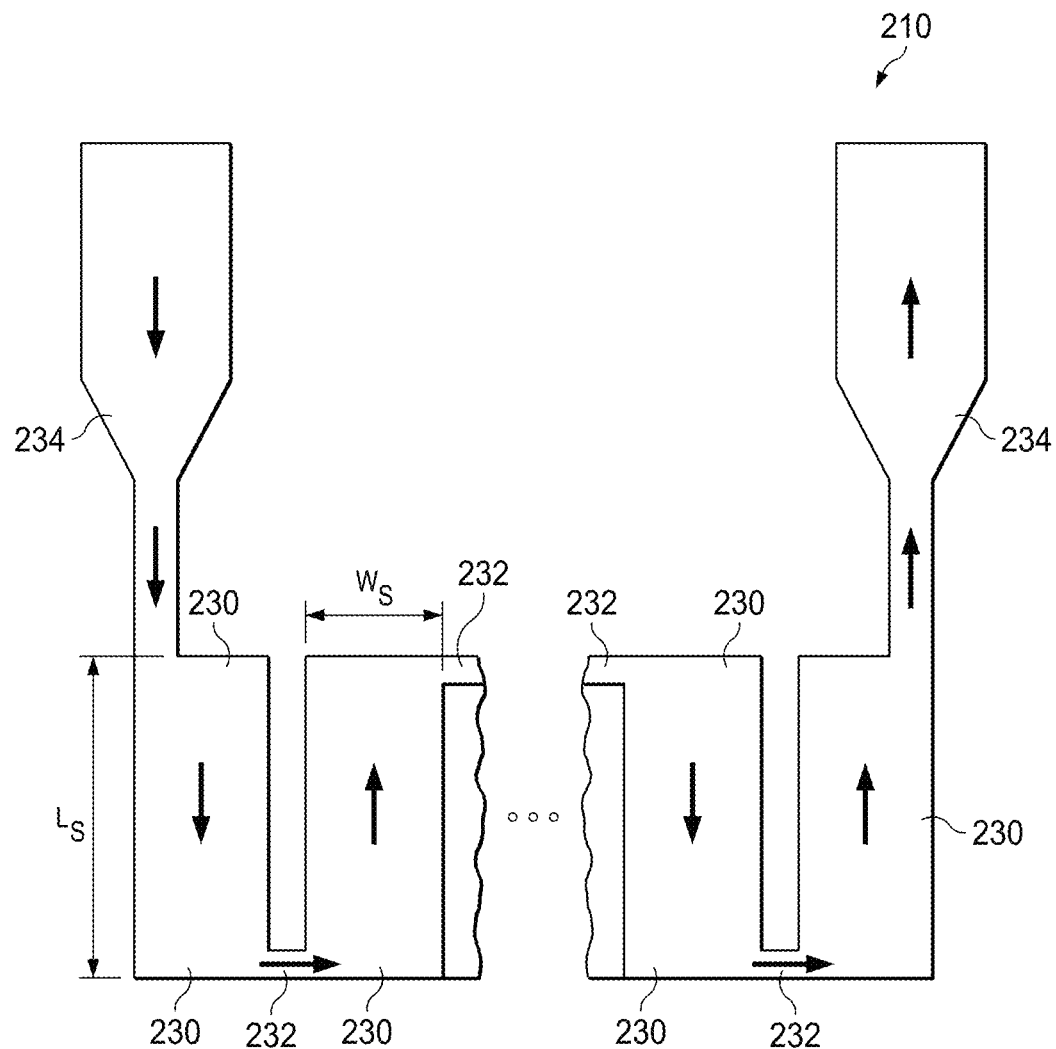
FIG. 5 shows an exemplary conductive pattern layer prior to roll-up, where the conductive pattern layer includes multiple conductive strips each having a length extending in a rolling or circumferential direction, such that the conductive strips wrap around the longitudinal axis in the rolled configuration.

Referring again to FIG. 2A, the conductive pattern layer 210 comprises at least one conductive strip 230 having a length extending in a rolling or circumferential direction, such that the conductive strip(s) 230 wrap around the longitudinal axis 208 in the rolled configuration. A plurality of the conductive strips 230 may be disposed along the direction of the longitudinal axis 208 and connected in series by connecting lines 232, as shown in FIG. 2A and in FIG. 5. Each conductive strip 230 has a width $w_s$ and a length $L_s$ along the rolling or circumferential direction. As will be discussed further below, the length of each conductive strip 230 may be up to several centimeters in length. For example, the length may be as large as about 2 cm, as large as 1 cm, as large as about 50 mm, or as large as about 10 mm. Typically, the length is at least about 1 mm, at least about 5 mm, or at least about 10 mm. The width of each conductive strip may be in a range from about 100 nm to about 500 nm, or from about 200 nm to about 350 nm.

The conductive pattern layer 210 may also comprise two conductive feed lines 234 connected to the conductive strips 230 to provide a pathway for passage of electrical current therethrough. The conductive feed lines 234 may not be part of the rolled configuration 206; that is, the conductive feedlines 234 may not wrap around the longitudinal axis 208. It is also possible that the conductive feed lines may not be present if a signal may be fed to the rolled-up electromagnetic component 202 by other means (e.g., by passive or active components on the chip). For a rolled-up inductor, each of the conductive strips 230 serves as an inductor cell, and the inductance may be maximized when the inductor cells 230 are aligned such that the length of each cell 230 is substantially parallel to (e.g., within ±1° of) the rolling direction. If the inductor cells 230 are positioned at a non-zero angle with respect to the rolling direction, the inductance may be reduced.

The conductive pattern layer 210 (and thus the conductive strips 230 and the connecting lines 232) may comprise one or more conductive materials selected from carbon, silver, gold, aluminum, copper, molybdenum, tungsten, zinc, palladium, platinum, and/or nickel. More typically, the one or more conductive materials may be selected from the group consisting of: carbon, gold, silver, aluminum, palladium, platinum, nickel, and copper. To form the conductive pattern layer 210, a conductive thin film may be deposited on a strained layer by a method such as sputtering or evaporation, and then the conductive thin film may be patterned using lithography and etching steps known in the art to create a conductive pattern. Typically, the conductive pattern layer 210 has a thickness in a range from about 150 nm to about 300 nm prior to roll-up. The conductive pattern layer 210 may comprise a continuous pattern and/or discrete pattern elements.

The strain-relieved layer 212 (which, prior to roll-up, may be referred to as the strained layer 212a) may comprise silicon nitride, silicon oxide, or boron nitride. Typically, the strain-relieved layer 212 (and the strained layer 212a) are formed from $SiN_x$ ($0.5 \leq x \leq 1.5$). The strained layer 212a may be formed by deposition (e.g., CVD) and patterning methods known in the art. The strain in the strained layer 212a may be introduced by compositional or structural differences between sublayers that are successively deposited so as to be in contact with each other. For example, adjacent contacting sublayers (e.g., top and bottom sublayers) may be formed with different lattice parameters and/or with different stoichiometries. To facilitate rolling up upon release from an underlying sacrificial layer 145 deposited on a substrate 150, the top sublayer 140a may have a smaller lattice parameter than the bottom sublayer 140b, as shown schematically in FIG. 1A. In such a circumstance, the top sublayer 140a comprises a residual tensile stress, and the bottom sublayer 140b comprises a residual compressive stress. The residual stress profile in the sublayers 140a, 140b may be reversed (compressive on top; tensile on bottom) in order to have the rolling proceed downward, instead of upward, which is possible for any of the embodiments described herein. It is also possible that a single layer may be formed with appropriate compositional and/or structural gradients across the layer to produce the desired stress profile in the strained layer. $SiN_x$ films deposited by PECVD may differ from single crystal films in that internal strain may be developed not by crystal lattice mismatch but rather by density differences and thermal mismatch achieved by appropriate deposition conditions. In one example, an oppositely strained $SiN_x$ bilayer may be deposited successively with low frequency (e.g., 375 kHz, compressive strain) and high frequency (e.g., 13.56 MHz, tensile strain) PECVD conditions. Depending on the deposition method and conditions, the strained layer may have a residual stress that varies over a wide range, such as from 478 MPa to −1100 MPa for silicon nitride ($SiN_x$) and from greater than 1000 MPa to less than −1000 MPa for metal thin films on $SiO_2$, where positive values of residual stress correspond to tensile stresses, and negative values correspond to compressive stresses. By carefully designing the residual stress mismatch in each sublayer, it is possible to generate a large enough driving force to overcome resistance and to continue rolling over a suitably long distance to form as many turns as needed. To create a higher residual stress mismatch during deposition of the strained $SiN_x$ sublayers, for example, and thus a smaller tube diameter, the PECVD environment may be changed by adjusting a ratio of the $SiH_4$ flow rate to the $NH_3$ flow rate or by optimizing the power of the RF source.

Typically, the strained layer 212a has a thickness from about 2 nm to about 200 nm; however, in some embodiments (e.g., in which single crystals are used), the thicknesses may be about 1 nm or less, down to a few monolayers or to one monolayer. Generally, the thickness is at least about 5 nm, at least about 10 nm, at least about 20 nm, at least about 30 nm, at least about 40 nm, or at least about 50 nm. The thickness may also be no more than about 200 nm, no more than about 150 nm, no more than about 100 nm, no more than about 80 nm, no more than about 60 nm, or no more than about 40 nm. When a large number of turns is required and the strained layer 212a includes two oppositely strained sublayers 236,238 (a bilayer), it may be advantageous for the sublayers to have the same thickness, as illustrated in FIG. 2A.

The sacrificial interlayer (or sacrificial layer) 218 may comprise a material that can be etched without removing or otherwise damaging the strained layer 212a. For example, single-crystalline or polycrystalline Ge, $GeO_x$, Si, and/or AlAs, and/or photoresist, may be used as the sacrificial layer 218. Typically, the sacrificial layer 218 has a thickness in a range from about 20 nm to about 200 nm. In one example, a strained bilayer comprising $SiN_x$ may be formed on a sacrificial layer comprising Ge that may be wet etched with hydrogen peroxide or vapor-phase etched with $XeF_2$. In another example, a strained bilayer comprising InAs/GaAs may be formed on a sacrificial layer comprising AlAs that may be etched away with hydrofluoric acid (HF). Deposition and patterning methods known in the art may be employed to form the sacrificial layer 218 on the substrate 222, which may comprise, for example, a silicon wafer, a silicon-on-insulator wafer, or a sapphire wafer.

An optional thin protective layer 220 may be deposited on the sacrificial layer 218 to prevent rolling detours or failures caused by pinholes in a strained layer comprising $SiN_x$. Suitable materials for the protective layer include alumina ($Al_2O_3$). Such a protective layer 220 may also be applied over the conductive pattern layer as a cover layer. Both optional protective/cover layers 220 may have a thickness in a range from about 2 nm to about 30 nm and may be applied using atomic layer deposition (ALD).

The magnetic layer 318 comprising the soft magnetic material 216 may have a thickness in a range from about 10 nm to about 10 microns. Larger thicknesses (e.g., in a range from about 500 nm (0.5 micron) to about 10 microns) may be achieved by depositing (e.g., electroplating) the magnetic layer post-roll-up, as described below.

The solid body 322 comprising the soft magnetic material 216 may be sized to fit the core 214; in other words, the solid body 322 may have dimensions determined by the length and/or diameter of the core 214 formed during roll-up. The length of the core 214 may be determined or influenced by the geometry of the conductive pattern layer 210 (e.g., the width, spacing, and number of conductive strips) and may vary over a wide range, such as from about 10 microns to about 8000 microns (8 mm). Accordingly, the length of the solid body 322 may be least about 10 microns, at least about 50 microns, at least about 100 microns, at least about 200 microns, or at least about 500 microns, and the length may also be about 8000 microns or less, about 5000 microns or less, or about 1000 microns or less. The diameter of the core 214 upon roll-up depends on the thickness of the multilayer sheet 204 as well as the amount of strain in the strained layer 212a prior to release of the sacrificial layer 218. A thicker multilayer sheet 204 may tend to roll to a larger inner diameter; however, a higher level of strain in the strained layer 212a can offset this effect, since the inner diameter (D) of the rolled configuration 206 is proportional to the thickness (t) of the multilayer sheet 204 and is inversely proportional to the amount of strain ($\varepsilon$) therein ($D \propto t/\varepsilon$). Typically, the core 214 has a diameter in a range from about 1 micron to about 1000 microns. Accordingly, the solid body 322 may have a diameter no more than about 1000 microns, no more than about 500 microns, no more than about 300 microns, or no more than about 100 microns. The diameter of the solid body 322 may also be at least about 1 micron, at least about 5 microns, or at least about 10 microns.

Magnetic particles 320 comprising the soft magnetic material 216 may have a spherical, irregular, cubic, polygonal, anisotropic, acicular, two-dimensional, and/or plate-like morphology. Typically, the magnetic particles 320 have a nominal size in a range from about 1 nm to about 10 microns, from 1 nm to about 1 micron, or from 1 nm to about 100 nm. Smaller magnetic particles 320 may be advantageous for reducing magnetic dipole-dipole interactions and maintaining a uniform dispersion within a ferrofluid 424 used to deliver the magnetic particles 320 into the core 214. Accordingly, the nominal size of the magnetic particles 320 is preferably in a range from about 1 nm to about 20 nm, or from about 1 nm to about 10 nm.

The soft magnetic material 216 may comprise iron oxide, such as $Fe_2O_3$ or $Fe_3O_4$, a ferrite such as a nickel ferrite, manganese ferrite, zinc ferrite, or cobalt ferrite, iron nitride, manganese selenide, a ferromagnetic metal or alloy, such as iron, nickel, cobalt, a nickel-iron alloy such as permalloy, and/or an iron-silicon-aluminum alloy, such as sendust. Exemplary ferrites may include $ZnFe_2O_4$, $MnFe_2O_4$, $NiFe_2O_4$, $CoFe_2O_4$, $Co_xNi_{1-x}Fe_2O_4$, $Co_xZn_{1-x}Fe_2O_4$, $Ni_xZn_{1-x}Fe_2O_4$, and/or $Mn_xZn_{1-x}Fe_2O_4$, where $0<x<1$. Ferrites or metals/alloys may be preferred over iron oxide for higher frequency applications.

As described above, a ferrofluid 424 may be employed to deliver the magnetic particles 320 into the core 214. The ferrofluid 424 may comprise the magnetic particles 320 suspended in a carrier fluid 426, which may be an aqueous or organic solvent such as water, hexane, acetone, isopropanol, butanol, benzyl alcohol, and/or pentanol. As explained above, it may be advantageous for the magnetic particles 320 to be small in size (e.g., to have a nominal size in a range from 1 nm to about 100 nm). The magnetic particles 320 may be present in the ferrofluid 424 at concentration of at least about 15 vol. %, at least about 30 vol. %, or at least about 40 vol. %, and as high as about 80 vol. %, as high as about 70 vol. %, or as high as about 60 vol. %.

To ensure a stable dispersion of magnetic particles 320 in the ferrofluid 424, steric and/or electrostatic repulsion strategies may be utilized. For example, the magnetic particles 320 may be functionalized with surface ligands, such as hydrocarbon ligands, and/or charged groups. To minimize van der Waals interactions, the dielectric constant of the carrier fluid 426 may be "matched" with that of the magnetic particles 320; for example, the carrier fluid 426 may have a dielectric constant within ±40% of the dielectric constant of the magnetic particles 320, or within ±20% of the dielectric constant of the magnetic particles 320. $Fe_2O_3$ nanoparticles have a dielectric constant of 14.2, for example, and dielectric constants of exemplary carrier fluids are provided in Table 1 below. With sufficient matching of dielectric constants, a homogeneous and stable ferrofluid 424 may be obtained.

TABLE 1

| Exemplary Carrier Fluids and Dielectric Constants | |
| --- | --- |
| Carrier Fluid | Dielectric Constant |
| Water | 80.1 |
| Hexane | 1.9 |

TABLE 1-continued

Exemplary Carrier Fluids and Dielectric Constants

| Carrier Fluid | Dielectric Constant |
| --- | --- |
| Acetone | 21 |
| Isopropanol | 22, 19 |
| Butanol | 17.5 |
| Benzyl alcohol | 13 |
| Pentanol | 14, 13.7, 3.3 |

To maximize the properties of the electromagnetic component 102, the ferrofluid 424 may have a saturation magnetization ($M_s$) of at least about 99 mT, at least about 500 mT, or at least about 1 T, and/or as high as about 5 T. The ferrofluid 424 may also or alternatively exhibit a maximum working frequency of at least about 450 MHz, at least about 700 MHz, or at least about 1 GHz, and/or as high as 5 GHz. The ferrofluid 424 may also or alternatively have an initial magnetic susceptibility of at least about 18, at least about 100, at least about 500, or at least about 1000 (SI units).

In addition to integrating a magnetic material 216 into the core, another strategy for approaching Tesla-level magnetic induction is significantly extending the length and/or width of the conductive strips 230. Based on a physical model, conductive strips 230 to be rolled-up may be tens of times longer than in previous work (e.g., up to several millimeters or up to 1-2 cm) and larger in cross sectional area (e.g., tens of square micrometers) for higher coil density and lower DC resistance, respectively.

Coincident with this strategy is the development of an improved etching approach to increase the etch rate of the sacrificial layer 218 and thus the roll-up speed of the multilayer sheet 204. Traditionally-used wet etching of the sacrificial layer (e.g., $H_2O_2$ etching of Ge) may take place at a rate of about 10 μm/hr, which may be too slow to release an extremely long multilayer sheet for rolling up in an acceptably short amount of time. A new gas-phase etching technique described in this disclosure allows for an increased etch rate to facilitate rolling up of larger multilayer sheets. In addition, vapor-phase etching also avoids problems inherent to soaking of the multilayer sheet in a liquid etchant.

Another strategy to significantly enhance magnetic induction is utilizing the electroplating approach referred to above to increase the thickness of the conductive pattern layer 210 (e.g., the conductive strips 230) post-roll-up. For example, a conductive pattern layer 210 having a thickness that can be successfully rolled up (e.g., in a range from 150 nm to 300 nm) may undergo a post-roll-up electroplating process to increase the thickness of the conductive pattern layer 210 to the microscale (e.g., from about 1 micron up to 10 microns). In other words, after roll-up, a conductive material may be directed into the core 214 and into the gaps between adjacent turns, such that the conductive material is deposited on and increases the thickness of the conductive pattern layer 210. This considerable thickness increase, in combination with (or as an alternative to) increasing the length and/or width of the conductive strips 230 as described above, may allow for a reduced DC resistance to be achieved without impairing the roll-up process.

Figure 6:
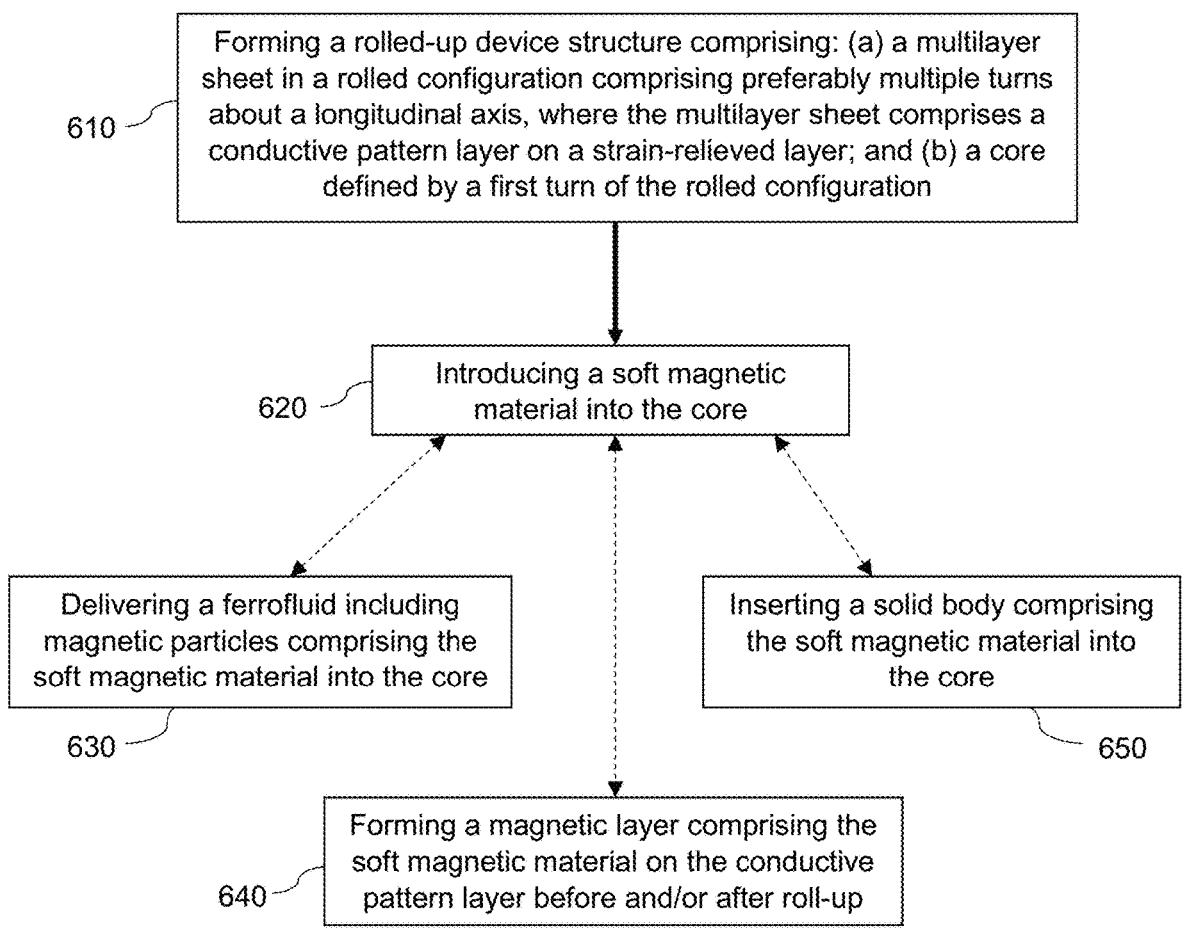
FIG. 6 is a flow chart of an exemplary method of making a rolled-up electromagnetic component.

Fabrication of the rolled-up electromagnetic components is now described in reference to the flow chart of FIG. 6. A method of making a rolled-up electromagnetic component includes forming 610 a rolled-up device structure comprising: a multilayer sheet in a rolled configuration comprising at least one or multiple turns about a longitudinal axis, the multilayer sheet comprising a conductive pattern layer on a strain-relieved layer; and a core defined by a first turn of the rolled configuration; and introducing 620 a soft magnetic material into the core. For example, a ferrofluid including magnetic particles comprising the soft magnetic material may be delivered 630 into the core. In another example, a magnetic layer may be formed 640 on the conductive pattern layer within the core before and/or after roll-up. In yet another example, a solid body comprising the soft magnetic material may be inserted 650 into the core. It can be beneficial to introduce the soft magnetic material into the core after roll-up due to the practical challenges inherent to rolling up a multilayer sheet of an excessive thickness. Typically, the rolled configuration comprises multiple turns about the longitudinal axis.

In some circumstances, the soft magnetic material may be introduced into the core during roll-up. For example, the soft magnetic material may be introduced into the core after the first turn but prior to completion of roll-up for a device structure having more than one turn. In another example, a magnetic layer comprising the soft magnetic material may be deposited on the conductive pattern layer prior to roll-up, and thus the soft magnetic material may be incorporated into the core during roll-up. It should be noted that an object or layer (such as the magnetic layer) which is described in this disclosure as being formed on, deposited on, disposed on or otherwise applied onto a different layer (such as the conductive pattern layer) may be understood to be formed directly on (i.e., in physical contact with) the different layer, or directly on an intervening layer which is on (or directly on) the different layer.

Referring again to FIG. 4, introducing the soft magnetic material 216 into the core 214 may entail positioning a tip of a delivery needle 428 containing a ferrofluid 424 adjacent to the core 214 at an end of the rolled-up device structure 240, where the tip includes a pendant drop (a suspended droplet) of the ferrofluid 424. The droplet and the end of the rolled-up device structure 240 are brought into contact, and capillary forces induce the ferrofluid 424 to flow into the core 214. Bringing the droplet and the end of the rolled-up device structure 240 into contact may entail bringing the tip of the delivery needle into contact with the end of the rolled-up device structure 240. After partially or completely filling the core 214 with the ferrofluid 424, the delivery needle 428 may be removed. Following delivery, the ferrofluid 424 may remain stably confined inside the core 214. The ferrofluid 424 may be dried to remove the carrier fluid 426, leaving the magnetic particles 320 packed within the core 214 of the rolled-up electromagnetic component 202. The process may be repeated one or more times to increase the packing density of magnetic particles 320 deposited in the core 214. The drying to remove the carrier fluid 426 may comprise active and/or passive drying. For example, the carrier fluid 426 may evaporate under ambient conditions (i.e., room temperature (about 20-25° C.) and atmospheric pressure). Alternatively, the drying may entail heating of the ferrofluid 424 and/or providing a forced gas flow over the electromagnetic component 202.

Figure 7A:
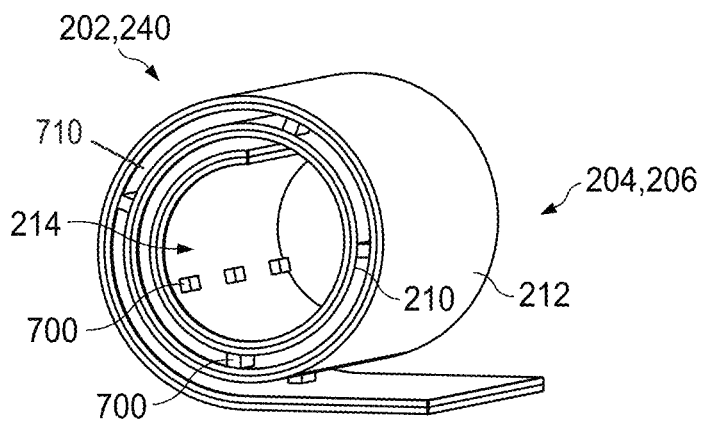
FIGS. 7A and 7B show a schematic and scanning electron microscope (SEM) image, respectively, of a rolled-up electromagnetic component that has spaced-apart adjacent turns due to the incorporation of spacers on the strained layer prior to roll-up.
Figure 7B:
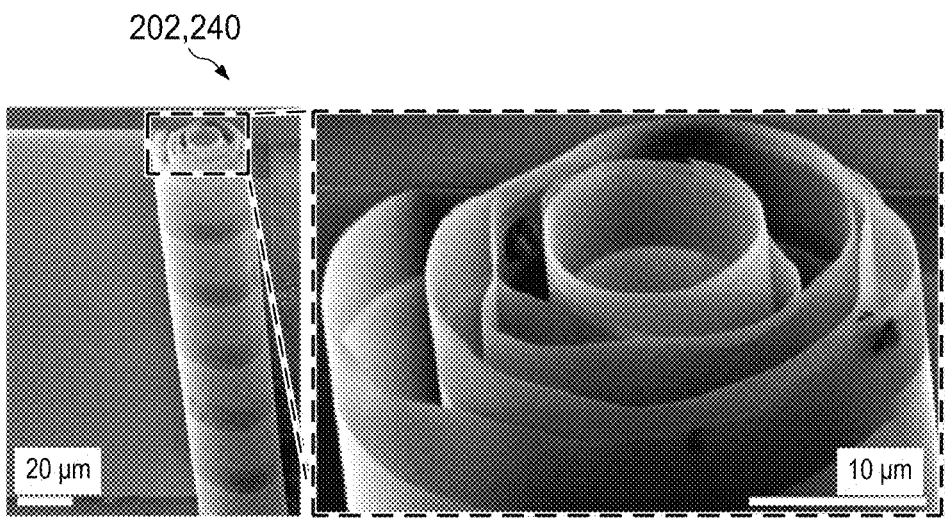
Figure 7C:
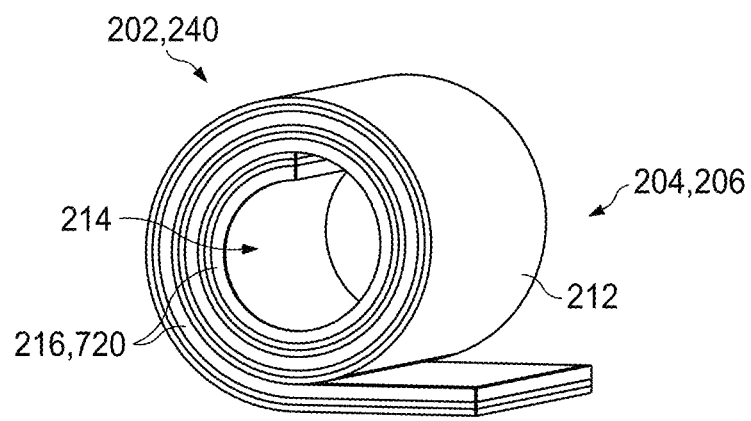
FIG. 7C shows a schematic of the rolled-up electromagnetic component of FIG. 7A after spaces between adjacent turns have been partially or completely filled with a soft magnetic material (and/or a conductive material), e.g., by electroplating.

Also or alternatively, the soft magnetic material 216 may be introduced into the core 214 by a deposition process such as electroplating, which may also be referred to as electrodeposition. In this case, fabrication of the rolled-up device structure 240 may include an additional step of incorporating spacers 700 on the thin film layers prior to roll-up, as described below, in order to produce a rolled-up device structure 240 with spaced-apart adjacent turns, as shown in FIGS. 7A and 7B. The soft magnetic material 216 and/or a conductive material 720 may be directed into spaces 710 between adjacent turns and onto the conductive pattern layer 210 by a process such as electroplating. Accordingly, the spaces 710 between adjacent turns may be partially or completely filled with the desired material (e.g., the soft magnetic material 216 and/or a conductive material 720), as illustrated in FIG. 7C.

A two-electrode electroplating system with a cathode electrically connected to one or more rolled-up device structures (e.g., on a sapphire wafer) and an anode in a suitable electroplating solution may be employed for electrodeposition. Suitable electroplating solutions may be selected depending on the metal or alloy to be deposited and may be obtained commercially (e.g., from Transene Company, Inc., Danvers, Mass.) or prepared using on recipes known in the art. Upon immersing the cathode/device structure(s) into the electroplating solution under appropriate electrolytic conditions (e.g., solution composition, pH, temperature, and current density), a magnetic layer comprising the soft magnetic material may be deposited onto the conductive pattern layer. Electroplating may also or alternatively be used to increase the thickness of the conductive pattern layer. In such a case, electroplating may be carried out using a different electroplating solution suitable for depositing the conductive material of the conductive pattern layer instead of the soft magnetic material of the magnetic layer. In some cases, two (or more) electroplating steps may be carried out. For example, a first electroplating step may be employed using a suitable electroplating solution to increase the thickness of the conductive pattern layer, and a second electroplating step may be employed using a suitable electroplating solution for depositing the soft magnetic material to form the magnetic layer. The thickness of the magnetic layer and/or the conductive layer may be controlled by the time duration of the electroplating process. Typically, electroplating is carried out at room temperature, but the electroplating system may be equipped with a heating element for controlled heating during electrodeposition if desired.

Figure 8A:
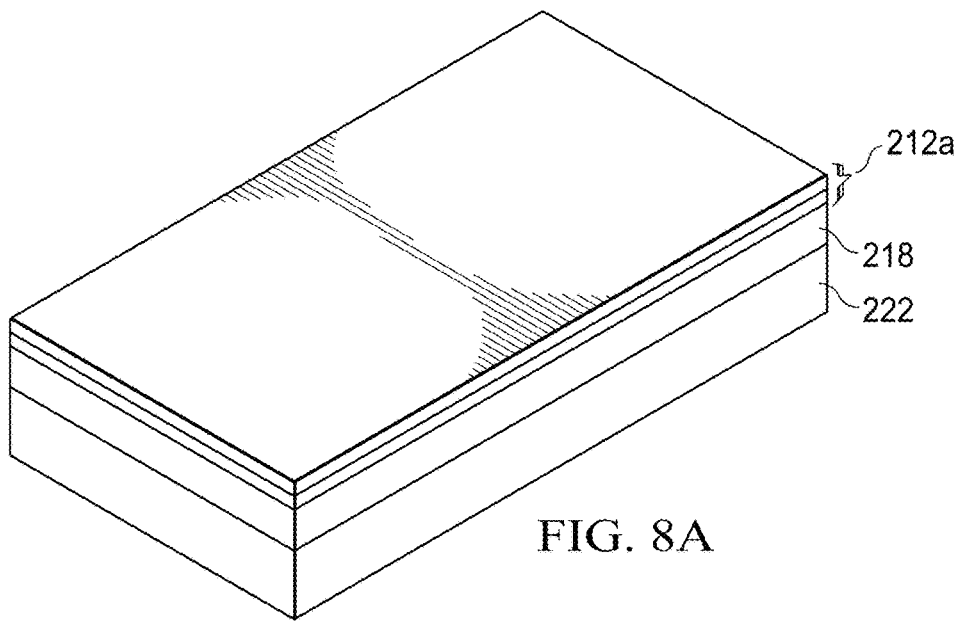
FIGS. 8A-8F illustrate an exemplary fabrication process of a rolled-up electromagnetic component through roll-up.
Figure 8B:
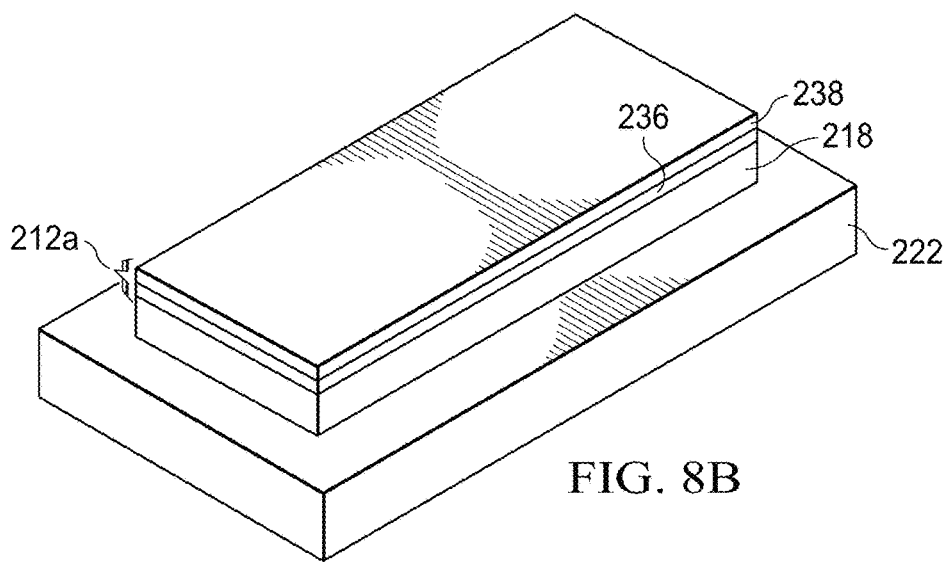
Figure 8C:
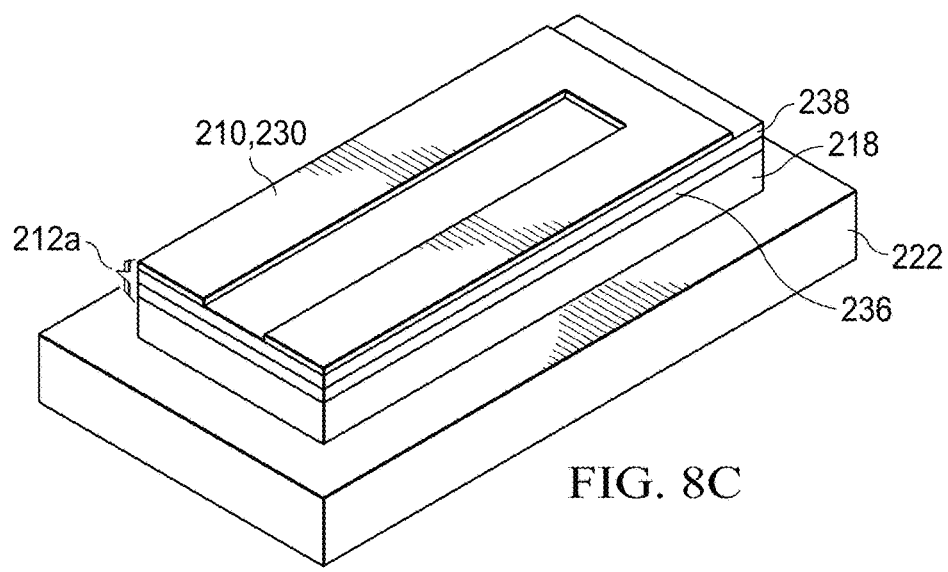
Figure 8D:
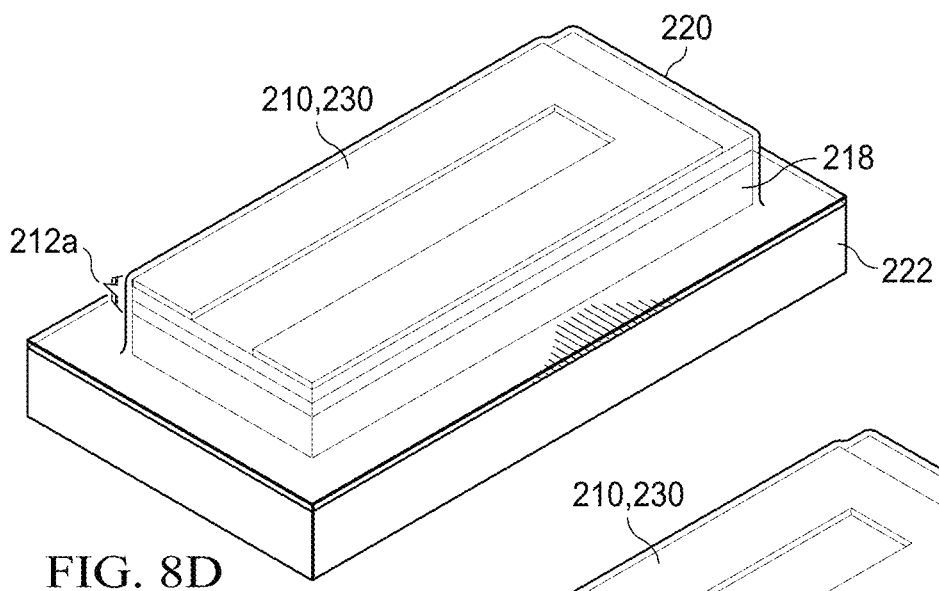

FIGS. 8A-8F illustrate an exemplary fabrication process through roll-up. As shown in FIGS. 8A and 8B, a sacrificial layer (e.g., Ge layer) 218 may be formed on a substrate (e.g., sapphire substrate) 222, and a strained layer (e.g., $SiN_x$ bilayer) 212a may be formed on the sacrificial layer 218. The layers are shown prior to patterning in FIG. 8A; in FIG. 8B the layers have been patterned to form a "mesa" structure. Typically, the sacrificial layer 218 has a relatively large Young's modulus to avoid absorbing strain energy from the strained layer 212a. The sacrificial layer 218 preferably also has a smooth surface to avoid decreasing the conductivity of the copper layer from surface roughness accumulation. A thin protective layer (not visible) comprising alumina ($Al_2O_3$), for example, may be deposited on the sacrificial layer 218 beneath the strained layer 212a to address the pinhole issue associated with the strained layer 212a. The strained layer 218 may comprise an upper portion 238 under tensile stress and a lower portion 236 under compressive stress, and the strained layer 212a may be held on the substrate 222 by the sacrificial layer 218. The compressive and tensile stresses may be formed in the strained layer by low frequency (LF) PECVD (to form the lower portion 236) and by high frequency (HF) PECVD (to form the upper portion 238). The compressive and tensile stresses may be maximized to provide sufficient rolling force to roll up a relatively thick conductive pattern layer (e.g., copper layer) 210, which, as shown in FIGS. 8C and 8D, is formed on the strained layer 212a. After the conductive pattern layer 210 is formed, a cover layer (e.g., $Al_2O_3$ layer) 220 may be deposited, as shown in FIG. 8D.

As described above, the conductive pattern layer 210 may comprise at least one conductive strip 230 having a length extending in a rolling direction. There may be an even number of conductive strips 230 deposited on the strained layer 210 and linked together by short connecting lines. In one example, the thickness of the conductive (e.g., Cu) strips 230 is from 150 nm to 250 nm with a width of from 250 µm to 300 µm, which yields a cross-sectional area from 37.5 $µm^2$ to 75 $µm^2$, and the number of conductive strips 230 may be chosen to be an even number up to six. Long and wide conductive strips are beneficially used because of the difficulty of rolling up micron-thick conductive strips 230, as discussed above. However, an undesirable corner effect may be introduced when the conductive strip 230 is excessively wide; thus, a rounded corner design of the conductive strips may be used to address this issue.

Figure 8E:
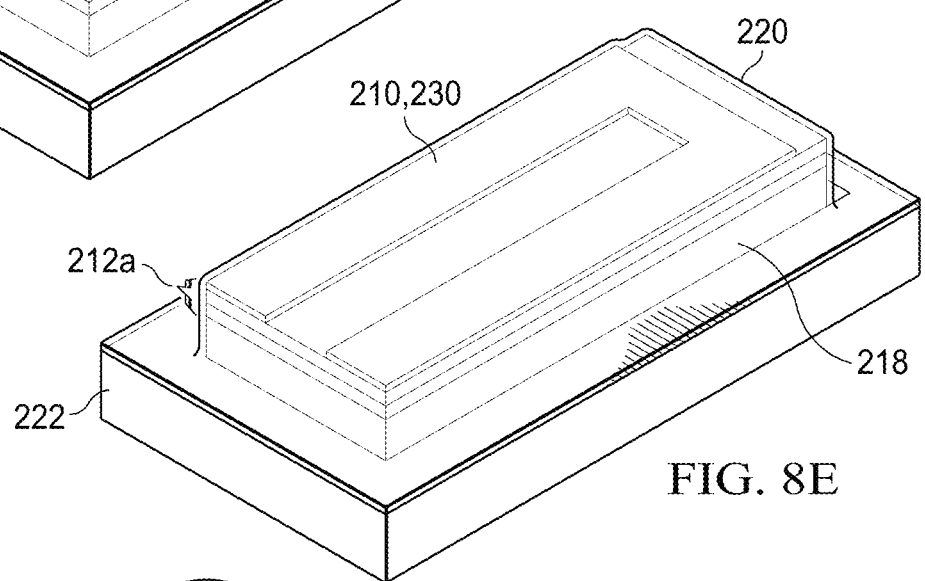
Figure 8F:
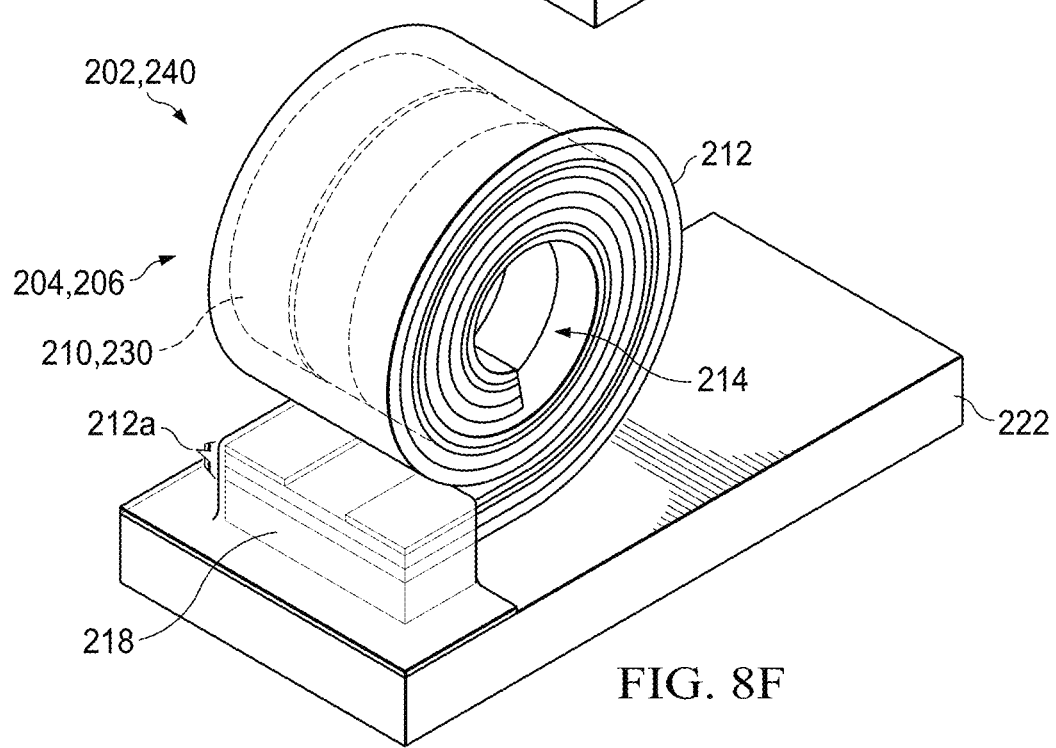

Referring to FIGS. 8E and 8F, removal of the sacrificial layer 218 from the substrate 222 may be initiated in order to release an end of the strained layer 212a, and the removal of the sacrificial layer 218 may be continued, thereby allowing the strained layer 212a to move away from the substrate 222 and roll up to relieve strain. The removal of the sacrificial layer 218 may entail wet or dry etching, as described below. The conductive pattern layer 210 adheres to the strained layer 212a during roll-up, and a rolled-up device structure 240 is formed.

Only three lithography steps may be needed to prepare the rolled-up device structure 240. A first lithography step is used to define the mesa, as shown in FIG. 8B. A second lithography step is used to define the 2D size and shape of the conductive pattern layer, as shown in FIG. 8C, which comprises two conductive strips in this example. A final lithography step in FIG. 8E opens an etching window on a far end of the mesa through a cover layer (e.g., $Al_2O_3$ layer) to facilitate etching of the sacrificial layer and realize directional rolling.

A critical enabler of the scaling scheme to roll up centimeter-scale and and longer conductive strips to increase the number of turns is to use a dry etching approach (e.g., gaseous xenon difluoride ($XeF_2$)) to release the sacrificial layer, which in these examples comprise Ge, instead of using traditional wet etching solutions. The dry etching releasing yields a rolling speed of up to about 750 µm/min, which is over 500 times faster than wet etching methods and provides the rolling momentum for a much heavier load, such as conductive strips of up to hundreds of nanometers in thickness, up to hundreds of microns in width, and up to one or more centimeters in length. In addition, the super-fast dry releasing speed may avoid the problems of detouring and failure associated with pinholes in the $SiN_x$ strained layers, even without a protective (e.g., $Al_2O_3$) layer when the rolling length is under 1 mm long.

Figure 9:
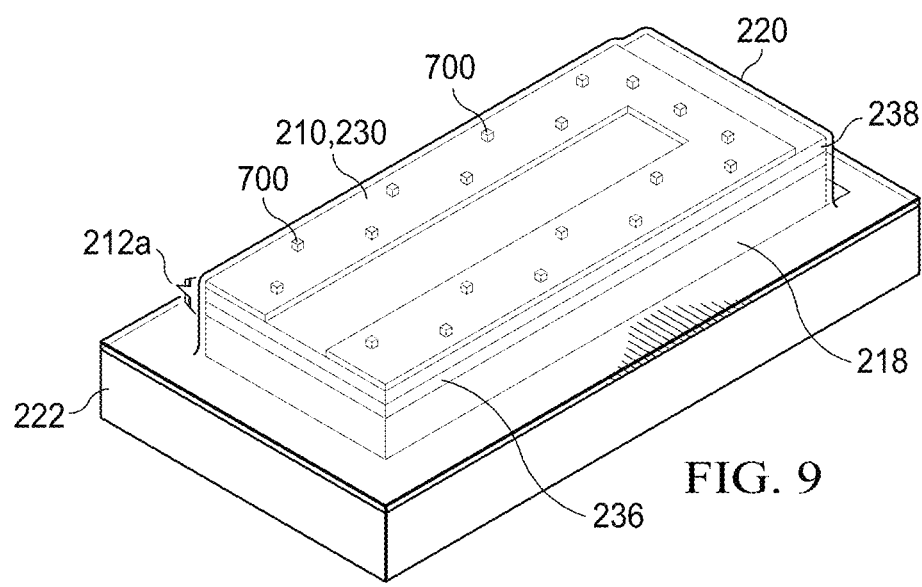
FIG. 9 is a schematic of thin film layers prior to roll-up, showing an exemplary placement of spacers on the thin film layers to create spaced-apart adjacent turns upon roll-up (as shown in FIGS. 7A and 7B).

In examples where a magnetic layer and/or an additional thickness of conductive material on the conductive pattern layer are deposited post-roll-up, the above-described fabrication process may be modified to incorporate discrete bumps on the strained layer (e.g., directly on the strained layer, the conductive pattern layer, and/or the optional spacer layer), as mentioned above and as illustrated in FIG. 9, to serve as spacers during roll-up. Consequently, the rolled-up device structures shown in FIGS. 7A and 7B may be formed.

Figure 10:
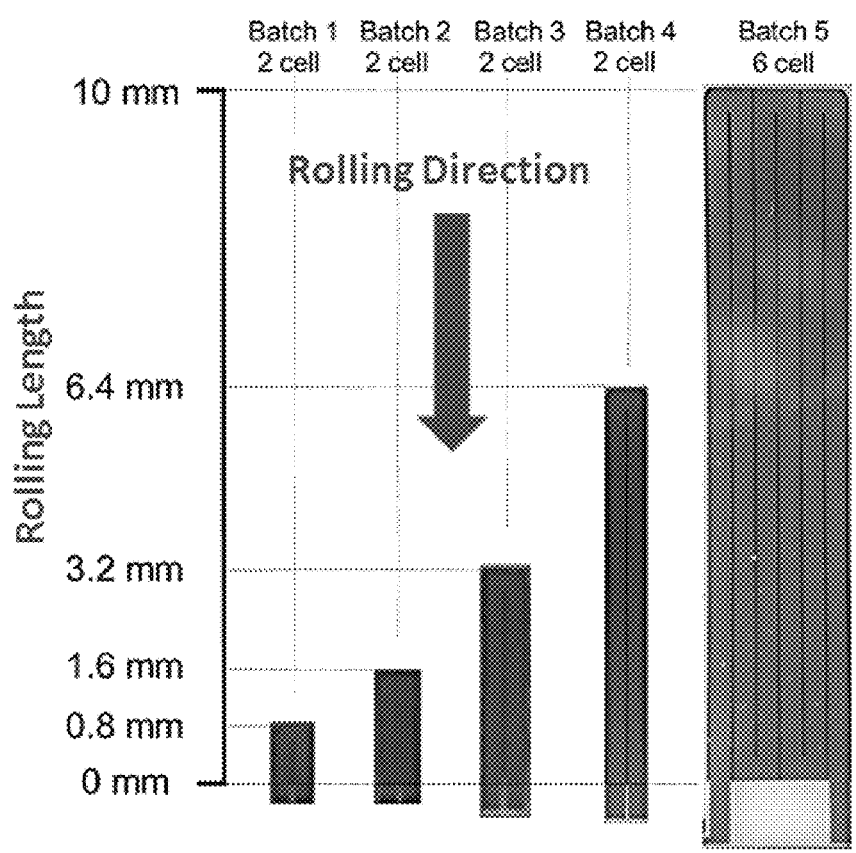
FIG. 10 shows a top-down view of the conductive pattern layer deposited on a strained layer for experimental Batches 1-5 prior to roll-up, providing a length comparison for the different batches.
Figure 11:
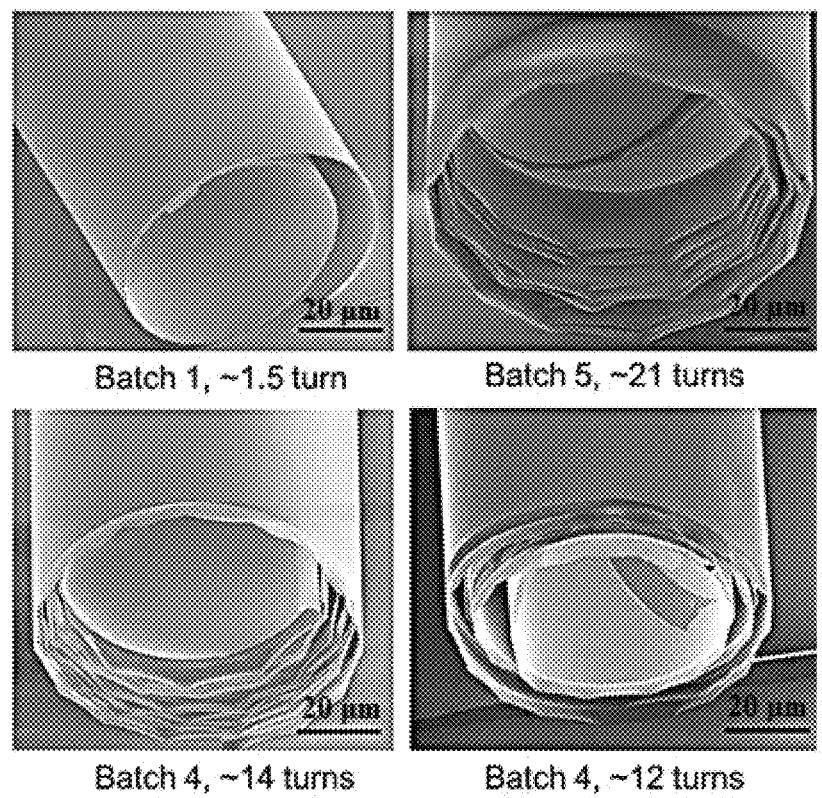
FIG. 11 shows SEM images of Batch 1, 2 and 4 rolled-up device structures having from about 1.5 to about 21 turns.

S-RuM power inductors with diverse geometry parameters and wide-ranging electrical performance can be realized in many different two-dimensional layout designs using a variety of core materials. Described here are five batches of S-RuM power inductors, where each is fabricated with a conductive pattern layer comprising Cu and having a thickness in a range from 150 nm to 225 nm. The batches have different numbers of cells (2 or 6) where each cell has the same width of 250 microns but different lengths scaled from 0.8 mm to 10 mm. Provided in FIG. 10 is a length comparison of all batches before rolling, where the images show a top-down view of the conductive pattern layer deposited on a strained layer for Batches 1-5. FIG. 11 shows scanning electron microscope (SEM) images of Batch 1, 2 and 4 rolled-up device structures having from about 1.5 to about 21 turns. The largest number of turns is obtained from the Batch 5 design (10 mm long conductive strip), which yields rolled-up device structures with up to 23 turns and an inner diameter of about 140 microns.

TABLE 2

Primary Dimensional Parameters of Exemplary S-RuM Inductors

| Batch # | Cu strip thickness | Cu strip width | Cu strip length | Inner diameter | # of cells | $Al_2O_3$ cover layer | $Al_2O_3$ underneath layer |
|---|---|---|---|---|---|---|---|
| 1 | | 250 μm | 0.8 mm | 165 μm | 2 | 15 nm | 0 |
| 2 | 150 nm | 250 μm | 1.6 mm | 165 μm | 2 | 15 nm | 0 |
| 3 | 225 nm | 300 nm | 3.2 mm | 200 μm | 2 | 15 nm | 0 |
| 4.1 | 150 nm | 300 nm | 6.4 mm | 180 μm | 2 | 25 nm | 0 |
| 4.2 | 180 nm | 300 nm | 6.4 mm | 140 μm | 4 | 20 nm | 5 |
| 5.1 | 180 nm | 300 nm | 10 mm | 140 μm | 4 | 20 nm | 5 |
| 5.2 | 180 nm | 300 nm | 10 mm | 140 μm | 6 | 20 nm | 5 |

Figure 12:
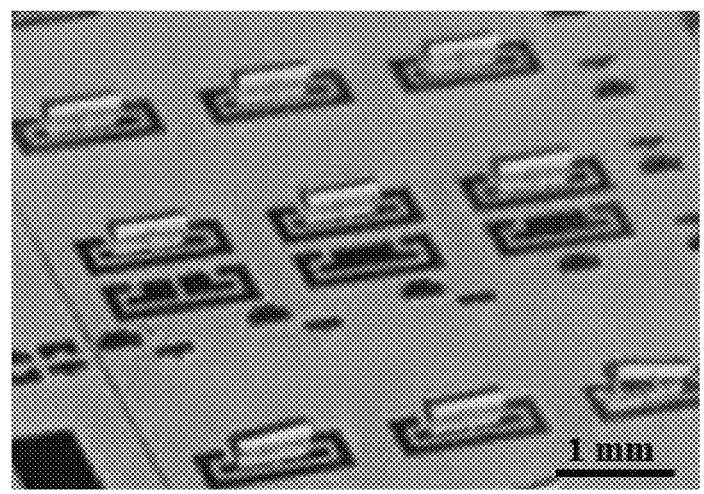
FIG. 12 shows a 3×3 array of fully fabricated and core-filled 2-inductor-cell rolled-up inductors.

FIGS. 4A and 4B described above illustrate a controllable core-filling process to fill the cores of the rolled-up device structures with ferrofluid to form rolled-up electromagnetic components, such as rolled-up power inductors. In this set of experiments, the ferromagnetic fluid is drawn into a 28-gauge micropipette (delivery needle) by capillary action, with a droplet suspended from the tip of the pipette. Then, the pipette is lowered until it is nearly level with the rolled-up device structure and is moved towards an end of the device structure to make contact. Finally, once contact is made between the device structure and the micropipette, the ferrofluid inside the pipette is drawn into the core, which has an even smaller diameter, by capillary action. A 3×3 array of fully fabricated and core-filled 2-cell S-RuM rolled-up inductors are shown in FIG. 12.

Figure 13A:
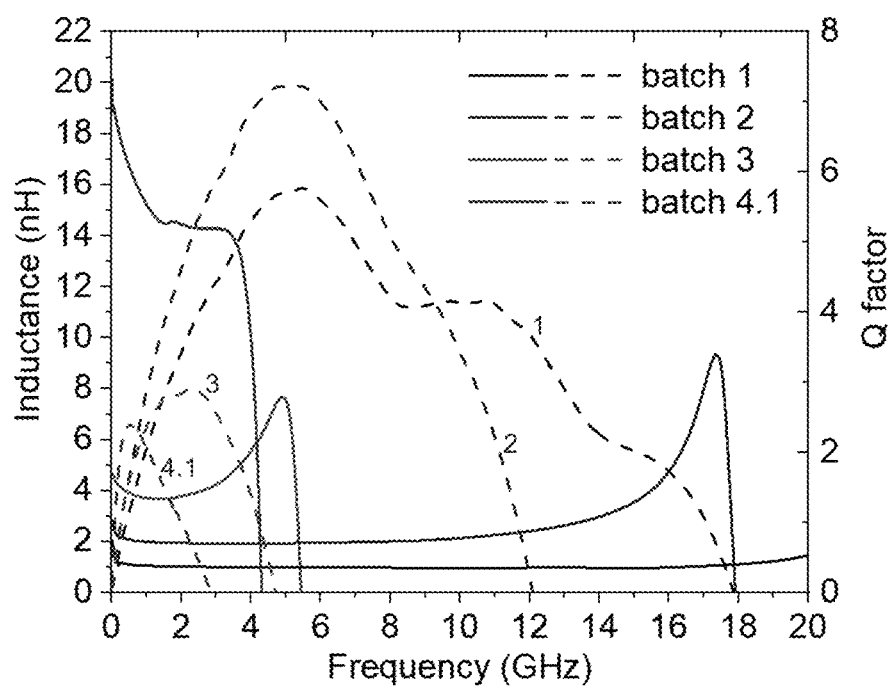
FIGS. 13A and 13B show the measured frequency dependence of the inductance and the Q factor of all batches of rolled-up device structures without a soft magnetic material in the core ("air-core devices").
Figure 13B:
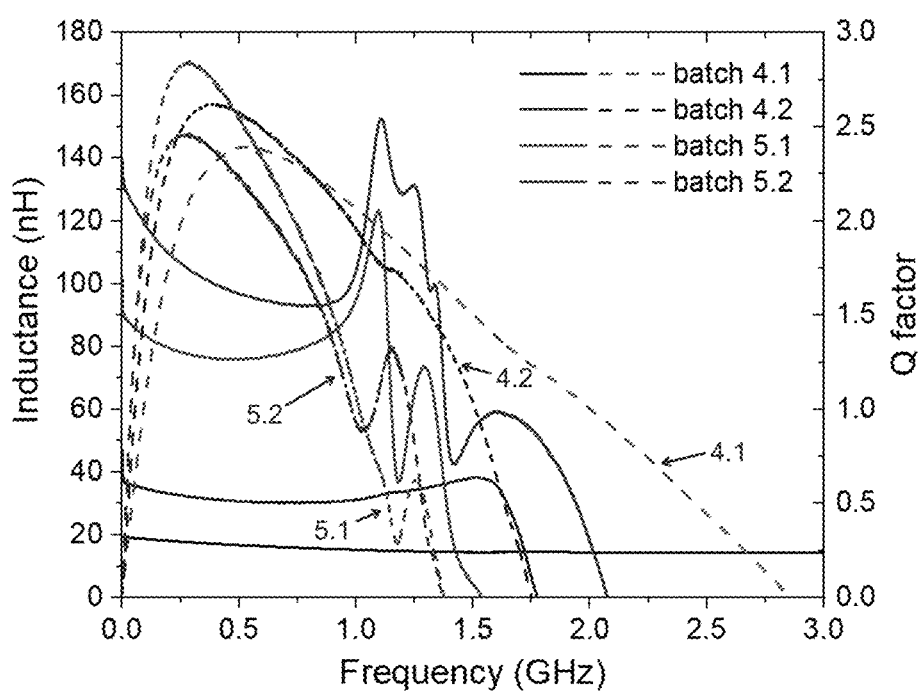

The measured frequency dependence of the inductance and the Q factor of all batches of devices without the core filled ("air-core devices") is shown in FIGS. 13A and 13B. Just as it was the case for S-RuM RF inductors reported previously, inductance shows a superlinear relationship with the number of turns. The Batch 5.2 device has an inductance as large as 140 nH at 10 MHz, a maximum working frequency at 2 GHz, and a maximum Q factor of 2.3 at 250 MHz. Compared to the Batch 1 device, the inductance per cell is improved by 46.7 times by increasing the length of the Cu strip by 12.5 times. The resonance frequency continues to drop from Batch 1 (>20 GHz) to Batch 5.2 (>1.3 GHz) but with rapidly decreasing rate due to the weakened influence of crosstalk coupling capacitance between turns. Importantly, this implies that, unlike their planar counterparts, S-RuM power inductors can exhibit a high operating frequency even when a larger inductance is obtained. The maximum Q factor at 250 MHz is ~2.85, improved by 11.4 times from the previously reported best result of ~0.25, due to the use of vapor-phase releasing, which enables roll-up of large cross-sectional-area Cu strips.

Figure 13C:
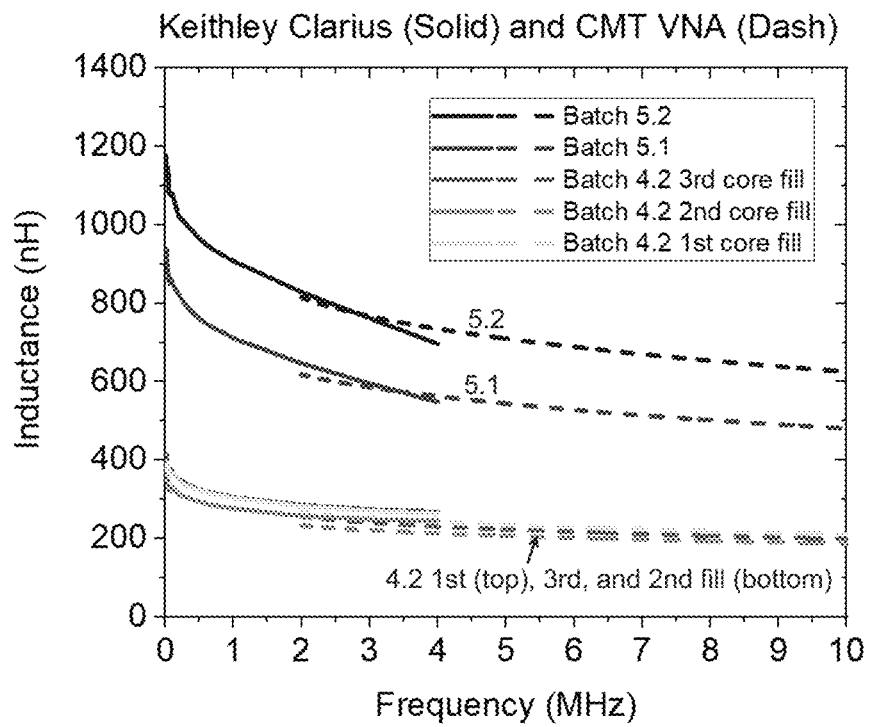
FIGS. 13C and 13D show the relationship between the inductance and the Q factor versus frequency at frequencies up to 10 MHz for rolled-up electromagnetic components with and without a soft magnetic material in the core.
Figure 13D:
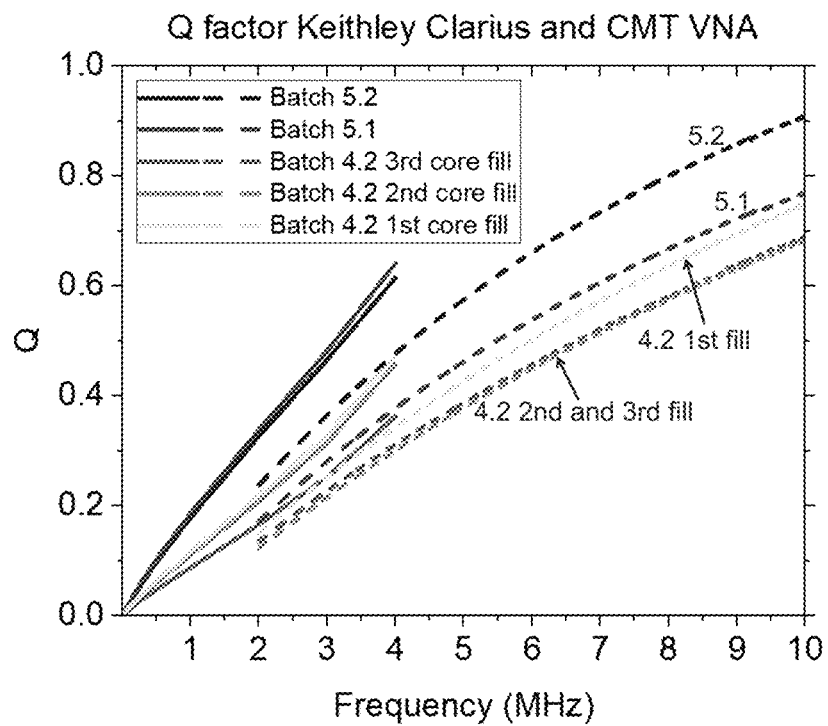
Figure 13E:
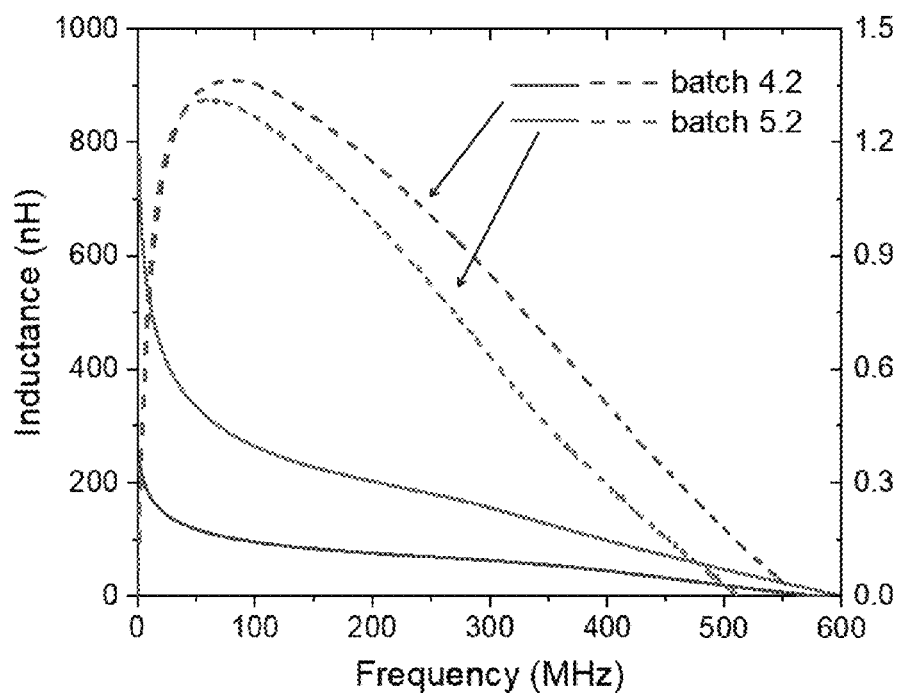
FIG. 13E shows the resonant frequency of the Batch 4.2 and 5.2 devices, each of which is above 500 MHz.
Figure 13F:
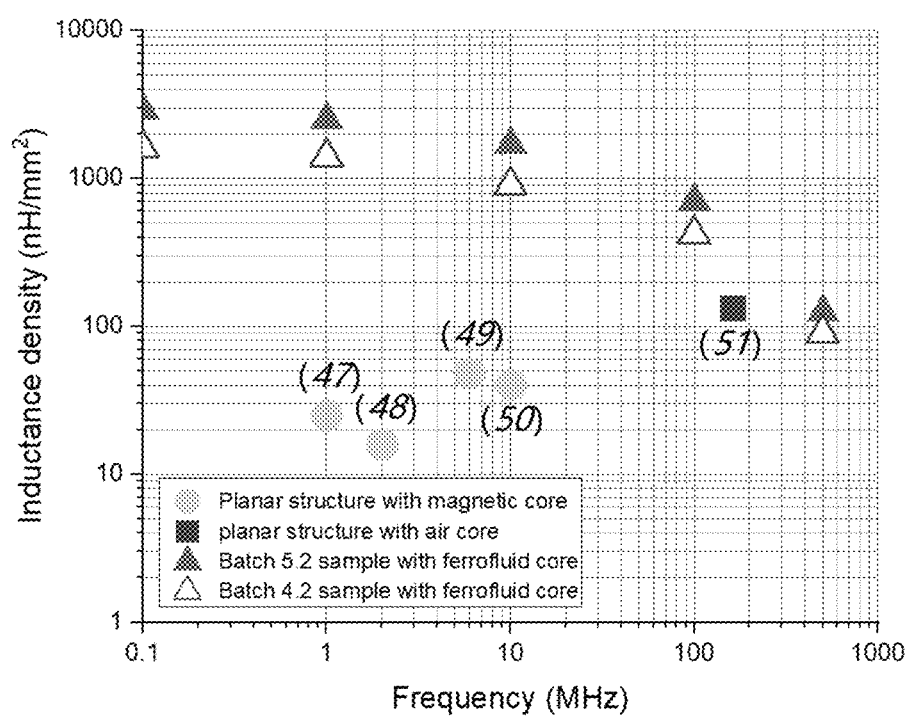
FIG. 13F compares the inductance density by area versus operating frequency of the rolled-up power inductors and other state-of-art planar counterparts from the literature.

Once the air core is filled by a ferrofluid, the operating frequency exhibits a drop due to the ferromagnetic resonance of the iron oxide nanoparticles used for this experimental study. To better study the performance of S-RuM power inductors at ultra-low frequency below 10 MHz, the data collected with a Keithley Clarius and CMT VNA are combined in FIGS. 13C and 13D to show the relationship between the inductance and the Q factor versus frequency. It can be seen that the inductance reaches 1.24 μH at 10 KHz and the maximum Q factor is 0.9 at 10 MHz for the Batch 5.2 device. The corresponding inductance area and volume density of 3 $μH/mm^2$ and 23 $μH/mm^3$, respectively. Compared to the air-core devices, the enhanced magnetic flux by ferrofluid at low frequency is about 9 times and 3 times, respectively, for the maximum inductance and the Q factor. The improvement in the Q factor is not as much as that of the inductance because of ferromagnetic resonance loss (FMR). To examine if the core of the rolled-up device structure is maximally filled by the ferrofluid (and thus maximally packed with magnetic particles), the Batch 4.2 device was filled and measured three times. A slight improvement is shown after the second filling, but nearly the same inductance (and Q factor) versus frequency is found between the second and third round of filling, as shown in FIGS. 13C and 13D, suggesting that two rounds of core filling are sufficient. FIG. 13E shows the resonant frequency of the Batch 4.2 and 5.2 devices, which are both above 500 MHz. Compared to bulk iron oxide material, monodomain iron oxide nanoparticles have a much large FMR frequency, which suggests an important application when both high power and high frequency are required. FIG. 13F compares the inductance density by area versus operating frequency between the S-RuM power inductor devices and other state-of-art planar counterparts from the literature (labeled 47-51). Clearly, the S-RuM devices show much higher inductance density across the entire frequency range and a unique capability in high frequency operation, which satisfies the requirement of a switching frequency range of 100 MHz to 500 MHz for the next generation of power devices. As discussed above, the performance can be further improved by simply scaling the conductive strips to longer lengths and/or widths and/or to materials with better conductivity.

Figure 13G:
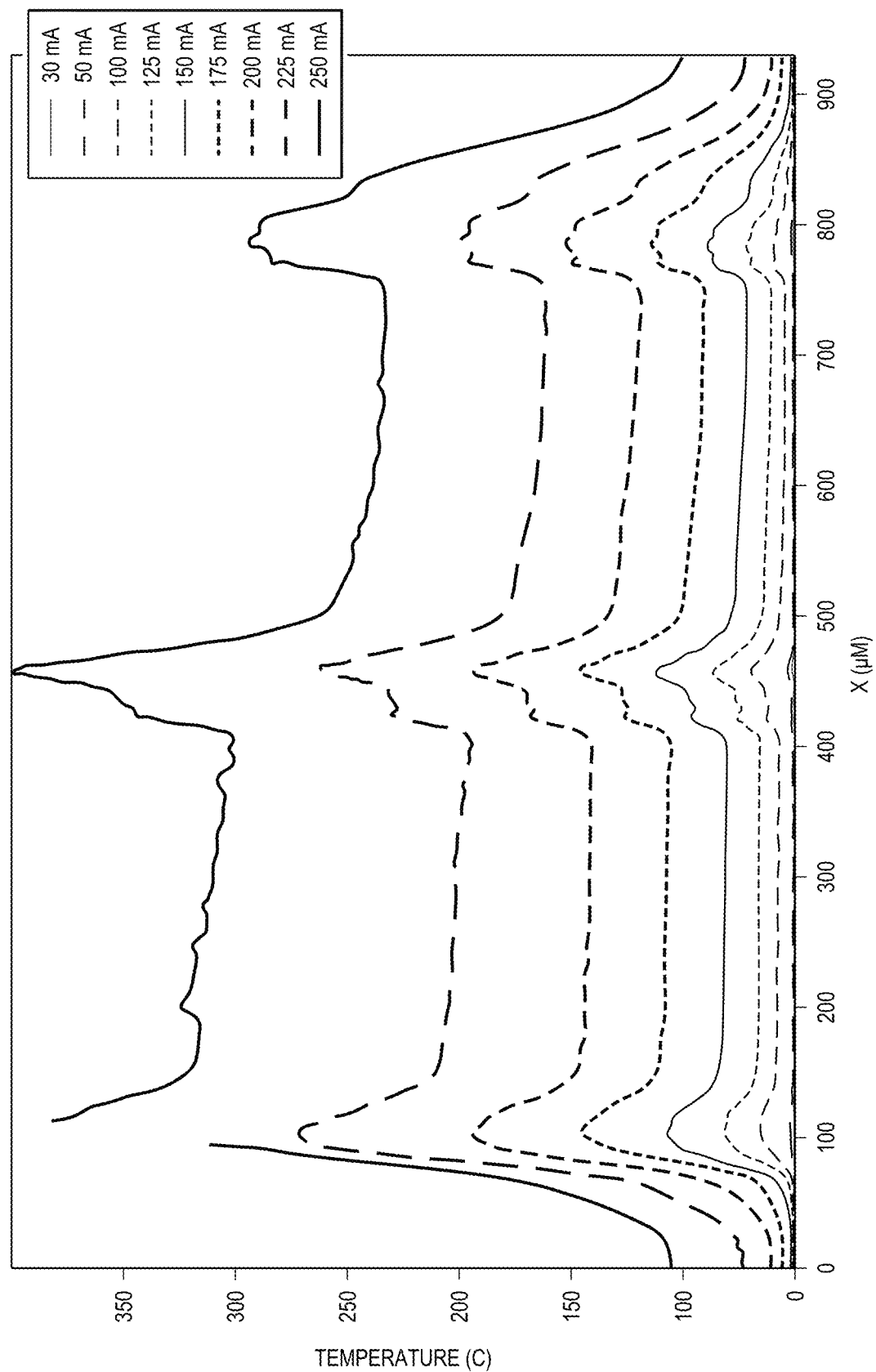
FIG. 13G shows a temperature distribution line scan of a Batch 4 air-core device.

Current handling ability is determined by measuring the thermal profile along the axial direction on top of the device using an infrared (IR) thermometer. Shown in FIG. 13G is a temperature distribution line scan of a Batch 4 air-core device. The background temperature is set to be 50° C. in order to obtain a reasonable signal to noise ratio. The input current is set to 250 mA with measured maximum temperature of about 400° C. without destroying the device. The data indicate that the maximum power of the Batch 4 SRuM power inductor should be above 0.94 W with a corresponding power density of about 8.5 $W/mm^2$ and a maximum magnetic induction of 12 mTesla in the core.

Example: Fabrication Details (1) Wafer (substrate) preparation. Sapphire Wafer, C-plane (0001); sonication in deionized (DI) water at room temperature for 1 min; acetone, methanol, isopropanol rinse, DI water rinse, and $N_2$ drying.

(2) Sacrificial layer deposition. 100 nm Ge is deposited by CHA E-beam evaporation.

(3) Protective underlayer deposition. 5 nm $Al_2O_3$ at 250° C. by Cambridge Savannah Nanotech ALD System.

(4) Strained bilayer growth. Dual-frequency STS-PECVD $SiN_x$ deposition: 20 nm LF $SiN_x$ deposition, 380 KHz RF power, 20 W, $SiH_4:NH_3=1:1$, 300 mT; 20 nm HF SiNx deposition, 13.56 MHz RF power, 20 W, $SiH_4:NH_3=4:5.5$, 900 mT.

(5) Patterning to define mesa. Spin on positive photoresist ("PR," AZ5214E); spin on HMDS; soft bake 1 min at 110° C.; expose with 320 nm UV lithography with optical photo mask; develop in MIF 917 developer for 75 sec; $O_2$ descum for PR residual removal; reactive ion etching with $CF_4$, 30 sccm gas flow, 90 W power, 35 mTorr pressure, for 6 mins; acetone, methanol, isopropanol rinse to strip PR, DI water rinse, $N_2$ drying; $O_2$ descum for PR residual removal.

(6) Conductive pattern (Cu) layer deposition. Spin on image reversal photoresist (AZ5214E-IR); spin on HMDS; soft bake 1 min at 110° C.; expose for 9 secs by 320 nm UV lithography with optical photo mask; reversal bake 1 min at 110° C.; flood exposure for 1 min by 320 nm UV lithography; develop in MIF 917 developer for 75 sec; $O_2$ descum for PR residual removal; ion descum in HCl for 2 mins; 5 nm Ni followed by 180 nm Cu deposited by electron beam evaporation; metal lift-off in AZ 400T stripper for 20 mins.

(7) Cover layer deposition. 20 nm $Al_2O_3$ at 250° C. by Cambridge Savannah Nanotech ALD System.

(8) Open window for contacts. Spin on image reversal photoresist (AZ5214E-IR); spin on HMDS; soft bake 1 min at 110° C.; expose for 9 secs by 320 nm UV lithography with optical photo mask; reversal bake 1 min at 110° C.; flood exposure for 1 min by 320 nm UV lithography; develop in MIF 917 developer for 70 sec; $O_2$ descum for PR residual removal; etching for 40 sec in 10:1 buffered oxide etch (BOE).

(9) Open releasing window. Spin on image reversal photoresist (AZ5214E-IR); spin on HMDS; soft bake 1 min at 110° C.; expose for 9 secs by 320 nm UV lithography with optical photo mask; reversal bake 1 min at 110° C.; flood exposure for 1 min by 320 nm UV lithography; develop in MIF 917 developer for 70 sec; $O_2$ descum for PR residual removal; etching for 40 sec in 10:1 BOE; reactive ion etching with $CF_4$, 30 sccm gas flow, 90 W power, 35 mTorr pressure, for 6 mins; acetone, methanol, isopropanol strip PR, DI water rinse, $N_2$ drying; $O_2$ descum for PR residual removal.

(10) Lateral etching for unidirectional roll-up. Prebake clean with acetone, methanol; end bake for 5 mins at 125° C.; lateral dry etching by Xactix $XeF_2$ Etching System, 3 T pressure, 60 sec cycles (to completion) to form a rolled-up device structure.

Figure 14:
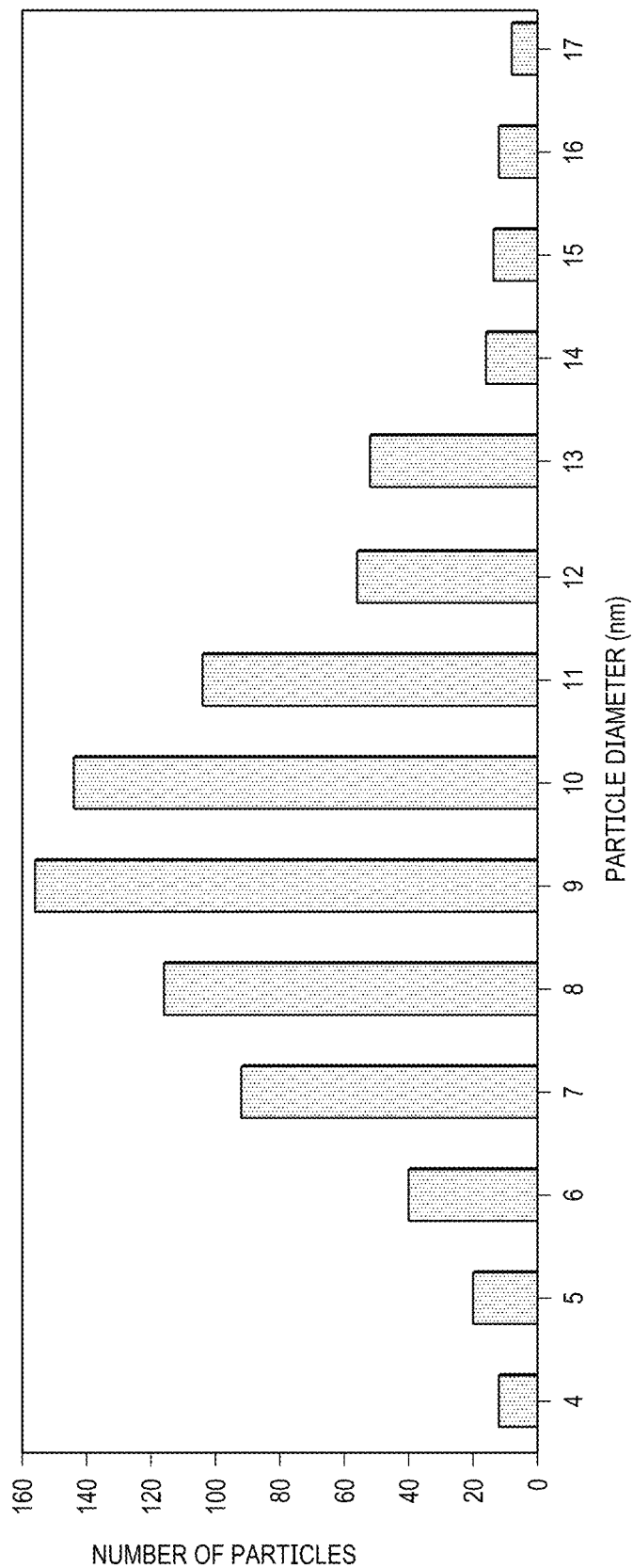
FIG. 14 shows an exemplary size distribution of iron oxide nanoparticles in a commercially available ferrofluid as determined from a transmission electron microscopy (TEM) image of the iron oxide particles.

(11) Core filling method. Ferrotec EMG 900 Oil-based ferrofluid placed in a small dish (about 1 mg). FIG. 14 shows the size distribution of the iron oxide nanoparticles as determined from a transmission electron microscopy (TEM) image of the EMG 900 nanoparticles. Prepare a 28 g, 67 mm, MicroFil micropipette (plastic+fused silica) and attach it into a micromanipulator for directional control. Draw ferrofluid into the micropipette from the dish by capillary action. Lower the micropipette tip under the microscope until it touches the end of the rolled-up device structure. The ferrofluid is drawn into the core by capillary action.

The disclosures of U.S. Pat. No. 9,224,532, entitled "Rolled-up Inductor Structure for a Radiofrequency Integrated Circuit (RFIC)," U.S. Pat. No. 9,330,829, entitled "Rolled-up Transformer Structure for a Radiofrequency Integrated Circuit (RFIC)," U.S. Patent Application Publication 2016/0301377, entitled "Tubular Resonant Filter and Method of Making a Tubular Resonant Filter," and U.S. Patent Application Publication 2018/0075956, entitled "Rolled-Up Power Inductor and Array of Rolled-Up Power Inductors for On-Chip Applications," are hereby incorporated by reference in their entirety.

Although considerable detail with reference to certain embodiments has been described, other embodiments are possible. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages, and it is not necessarily expected that all of the described advantages will be achieved with every embodiment.

The invention claimed is:

1. A rolled-up electromagnetic component for on-chip applications, the rolled-up electromagnetic component comprising:
   a multilayer sheet in a rolled configuration comprising at least one turn about a longitudinal axis, the multilayer sheet comprising a conductive pattern layer on a strain-relieved layer;
   a core defined by a first turn of the rolled configuration; and
   a soft magnetic material disposed within the core,
   wherein a magnetic layer comprising the soft magnetic material is disposed on the conductive pattern layer.

2. The rolled-up electromagnetic component of claim 1, wherein
   the soft magnetic material comprises iron, nickel, chromium, iron oxide, a ferrite, iron nitride, manganese selenide, a nickel-iron alloy, and/or an iron-silicon-aluminum alloy.

3. The rolled-up electromagnetic component of claim 2, wherein the ferrite is selected from the group consisting of: $ZnFe_2O_4$, $MnFe_2O_4$, $NiFe_2O_4$, $CoFe_2O_4$, $Co_xNi_{1-x}Fe_2O_4$, $Co_xZn_{1-x}Fe_2O_4$, $Ni_xZn_{1-x}Fe_2O_4$, $Mn_xZn_{1-x}Fe_2O_4$, where $0<x<1$.

4. The rolled-up electromagnetic component of claim 1, wherein magnetic particles comprising the soft magnetic material are disposed within the core.

5. The rolled-up electromagnetic component of claim 1, wherein a solid body comprising the soft magnetic material is disposed within the core.

6. The rolled-up electromagnetic component of claim 1, wherein the strain-relieved layer comprises silicon nitride, and
   wherein the conductive pattern layer comprises carbon, gold, silver, aluminum, palladium, platinum, and/or copper.

7. The rolled-up electromagnetic component of claim 1, wherein the conductive pattern layer comprises at least one conductive strip having a length extending in a rolling direction so as to wrap around the longitudinal axis in the rolled configuration, the length being at least about 1 mm.

8. The rolled-up electromagnetic component of claim 1 being selected from the group consisting of: a rolled-up inductor, a rolled-up transformer, and a tubular resonant filter.

9. The rolled-up electromagnetic component of claim 8, wherein the rolled-up inductor comprises an inductance of at least about 1 µH at a frequency up to 10 MHz.

10. An array of rolled-up electromagnetic components, each rolled-up magnetic component comprising:
- a multilayer sheet in a rolled configuration comprising at least one turn about a longitudinal axis, the multilayer sheet comprising a conductive pattern layer on a strain-relieved layer;
- a core defined by a first turn of the rolled configuration; and
- a soft magnetic material disposed within the core.

11. A method of making a rolled-up electromagnetic component, the method comprising:
- forming a rolled-up device structure comprising: a multilayer sheet in a rolled configuration comprising at least one or multiple turns about a longitudinal axis, the multilayer sheet comprising a conductive pattern layer on a strain-relieved layer; and a core defined by a first turn of the rolled configuration; and
- introducing a soft magnetic material into the core,
- wherein introducing the soft magnetic material into the core comprises:
- delivering a ferrofluid including magnetic particles comprising the soft magnetic material into the core; and/or
- inserting a solid body comprising the soft magnetic material into the core; and/or
- depositing a magnetic layer comprising the soft magnetic material on the conductive pattern layer after forming the rolled-up device structure.

12. The method of claim 11, wherein the soft magnetic material is introduced into the core as the rolled-up device structure is being formed, the multilayer sheet further comprising, prior to roll-up, a magnetic layer comprising the soft magnetic material on the conductive pattern layer.

13. The method of claim 11, wherein the conductive pattern layer comprises at least one conductive strip having a length extending in a rolling direction, the length of the conductive strip being at least about 1 mm.

14. The method of claim 11, wherein forming the rolled-up device structure comprises:
- forming a sacrificial layer on a substrate;
- forming a strained layer on the sacrificial layer, the strained layer comprising an upper portion under tensile stress and a lower portion under compressive stress, the strained layer being held on the substrate by the sacrificial layer;
- forming a conductive pattern layer on the strained layer;
- initiating removal of the sacrificial layer from the substrate, thereby releasing an end of the strained layer, and
- continuing the removal of the sacrificial layer, thereby allowing the strained layer to move away from the substrate and roll up to relieve strain in the strained layer, the conductive pattern layer adhering to the strained layer during the roll-up, and
- thereby forming the rolled-up device structure.

15. The method of claim 14, wherein removing the sacrificial layer comprises vapor-phase etching of the sacrificial layer.

16. The method of claim 14, further comprising forming discrete bumps on the strained layer to serve as spacers during roll-up, wherein, during the roll-up, the discrete bumps keep adjacent turns spaced apart such that the rolled-up device structure includes gaps between adjacent turns.

17. The method of claim 16, further comprising, after the roll-up, directing a soft magnetic material into the core and into the gaps between adjacent turns, the soft magnetic material being deposited on the conductive pattern layer as a magnetic layer.

18. The method of claim 16, further comprising, after the roll-up, directing a conductive material into the core and into the gaps between adjacent turns, the conductive material being deposited on and increasing a thickness of the conductive pattern layer.

19. A rolled-up electromagnetic component for on-chip applications, the rolled-up electromagnetic component comprising:
- a multilayer sheet in a rolled configuration comprising at least one turn about a longitudinal axis, the multilayer sheet comprising a conductive pattern layer on a strain-relieved layer;
- a core defined by a first turn of the rolled configuration; and
- a soft magnetic material disposed within the core,
- wherein magnetic particles comprising the soft magnetic material are disposed within the core.

* * * * *